United States Patent
Kondoh et al.

(10) Patent No.: US 11,493,392 B2
(45) Date of Patent: Nov. 8, 2022

(54) SENSOR SHEET, ROBOT HAND, AND GLOVE

(71) Applicants: Hitoshi Kondoh, Kanagawa (JP); Kazuhito Kishi, Kanagawa (JP); Atsushi Ohshima, Osaka (JP); Masami Takai, Tokyo (JP)

(72) Inventors: Hitoshi Kondoh, Kanagawa (JP); Kazuhito Kishi, Kanagawa (JP); Atsushi Ohshima, Osaka (JP); Masami Takai, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 246 days.

(21) Appl. No.: 17/038,392

(22) Filed: Sep. 30, 2020

(65) Prior Publication Data
US 2021/0102851 A1    Apr. 8, 2021

(30) Foreign Application Priority Data

Oct. 3, 2019   (JP) .............................. JP2019-183125
Aug. 7, 2020   (JP) .............................. JP2020-135318

(51) Int. Cl.
| | |
|---|---|
| *G01L 1/22* | (2006.01) |
| *H01L 27/28* | (2006.01) |
| *A41D 19/00* | (2006.01) |
| *G01K 7/16* | (2006.01) |
| *B25J 13/08* | (2006.01) |
| *H01L 51/05* | (2006.01) |

(52) U.S. Cl.
CPC ............ *G01L 1/22* (2013.01); *A41D 19/0027* (2013.01); *B25J 13/085* (2013.01); *G01K 7/16* (2013.01); *H01L 27/283* (2013.01); *H01L 51/0541* (2013.01)

(58) Field of Classification Search
CPC . G01L 1/22; G01K 7/16; H01L 27/283; B25J 13/085
See application file for complete search history.

(56) References Cited

U.S. PATENT DOCUMENTS 10,170,348 B2 *  1/2019  Nishi ................ H01L 21/67742
2018/0348073 A1* 12/2018  Biesheuvel ............... G01L 1/18

FOREIGN PATENT DOCUMENTS

| JP | 2010-079196 | 4/2010 | |
|---|---|---|---|
| JP | 2016-136612 | 7/2016 | |
| JP | 2016136612 A * | 7/2016 | ........... H01L 29/786 |

(Continued)

*Primary Examiner* — Jamel E Williams
(74) *Attorney, Agent, or Firm* — IPUSA, PLLC

(57) ABSTRACT

A sensor sheet includes unit sensor sheets configured to detect a physical property value at multiple points on a sensor layer, each unit sensor sheet including a first substrate, and an electrode layer and the sensor layer sequentially formed on one side of the first substrate; and a wiring substrate to which the unit sensor sheets are configured to be coupled, the wiring substrate including a second substrate, and a plurality of wirings provided on one side of the second substrate. One side of the wiring substrate and one side of each unit sensor sheet are facing each other. A conductive bonding member configured to electrically couple each unit sensor sheet and the wiring substrate with each other, is included between the electrode layer of each unit sensor sheet and at least one of the wirings of the wiring substrate.

9 Claims, 31 Drawing Sheets

(56) References Cited

FOREIGN PATENT DOCUMENTS

| JP | 5983845 | 9/2016 | | |
|----|---------|--------|---|---|
| JP | 2017-071469 | 4/2017 | | |
| JP | 6484563 | 3/2019 | | |
| JP | 2019086448 A | * | 6/2019 | |
| JP | 2019184509 A | * | 10/2019 | ............... G01L 1/20 |
| WO | WO-2019026737 A1 | * | 2/2019 | ............... G01K 7/16 |

* cited by examiner

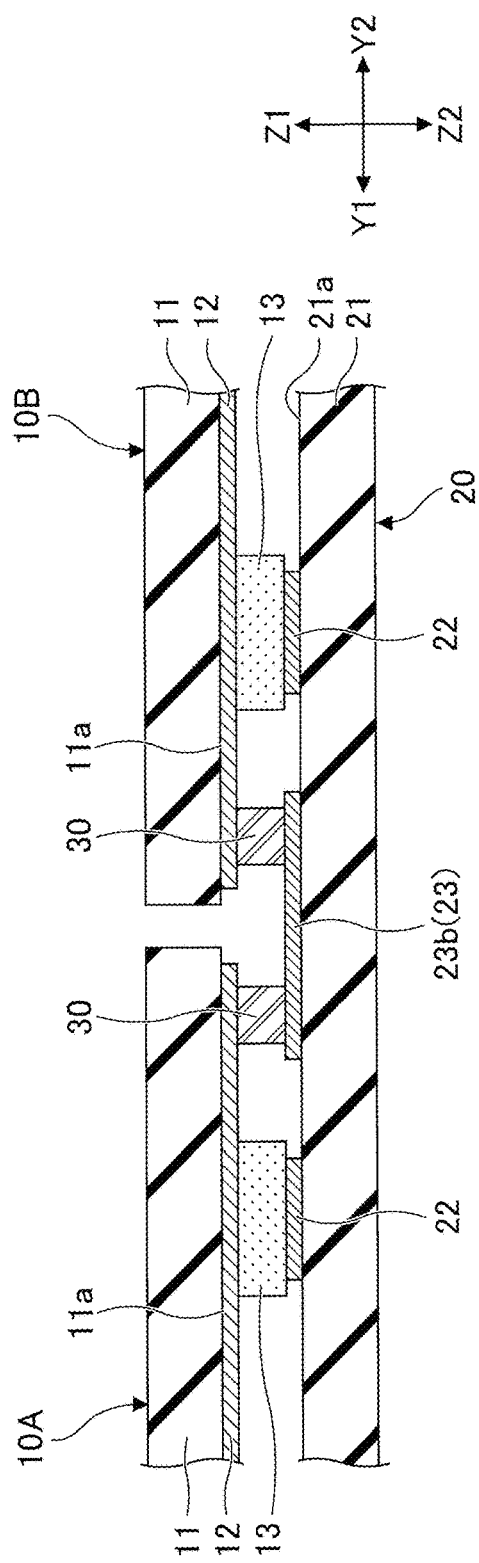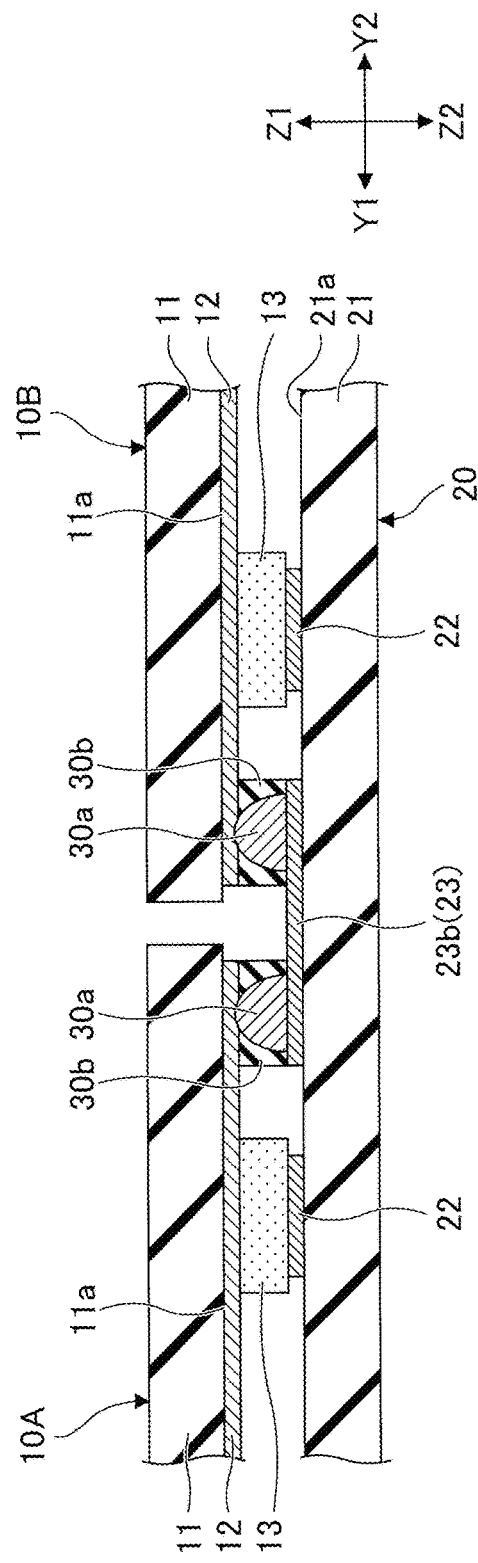

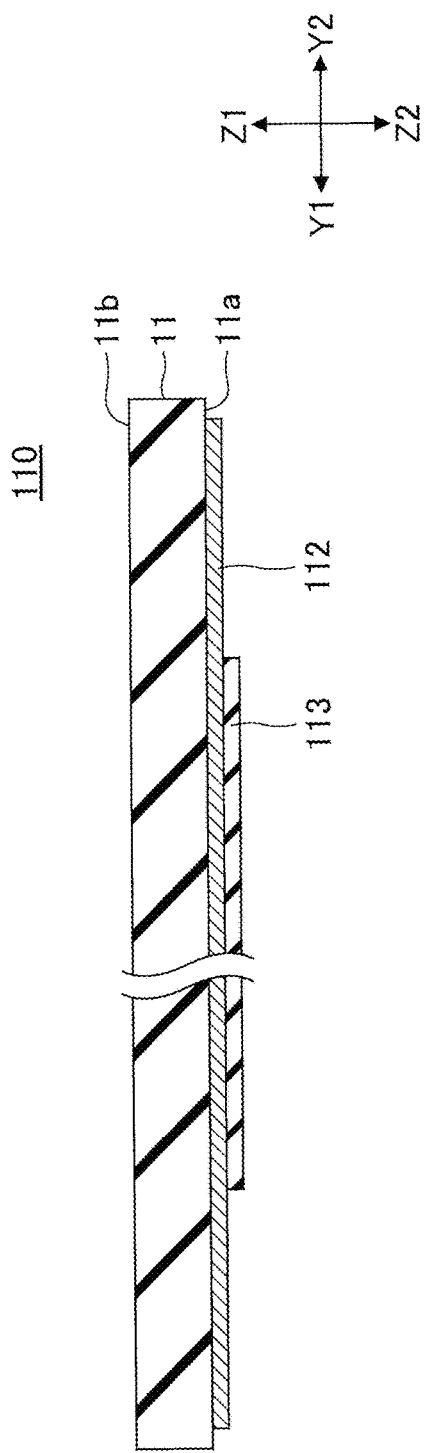
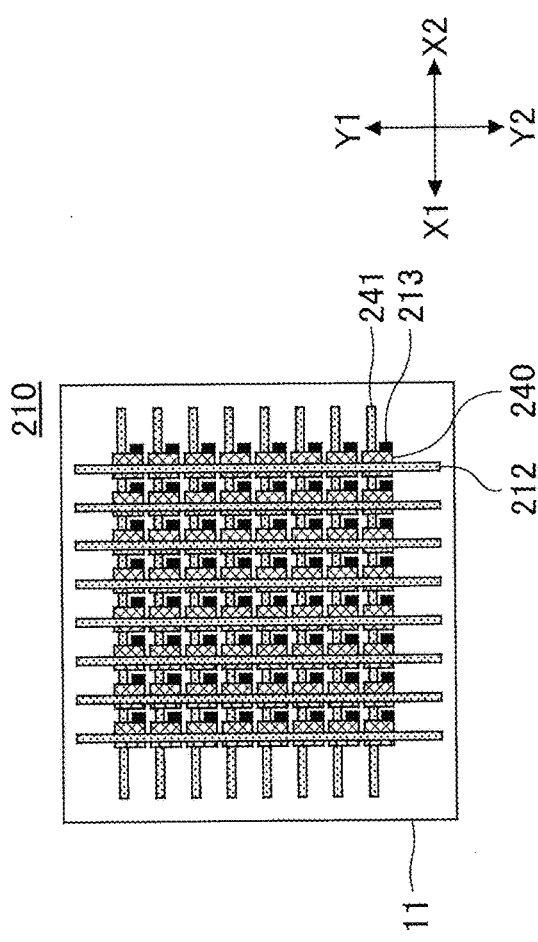

SENSOR SHEET, ROBOT HAND, AND GLOVE

CROSS-REFERENCE TO RELATED APPLICATION

The present application is based on and claims priority under 35 U.S.C. § 119 to Japanese Patent Application No. 2019-183125, filed on Oct. 3, 2019, and Japanese Patent Application No. 2020-135318, filed on Aug. 7, 2020, the contents of which are incorporated herein by reference in their entirety.

BACKGROUND OF THE INVENTION

1. Field of the Invention

The present invention relates to a sensor sheet, a robot hand, and a glove.

2. Description of the Related Art

Along with the development of Internet of Things (IoT), there is a growing need to install sensors in all types of objects. In particular, there is a growing need for a sheet-like multi-point detection sensor suitable for recognizing (the state of) an object.

For example, there has been proposed a shelf management system that uses a pressure sensor sheet to identify the type, the number, and the arrangement of articles disposed on shelves in stores and the like. To identify the state of such articles, large-area, high-definition sensor sheets have been used, and it has generally not been easy to manufacture such sensor sheets in high yield.

Also, a method referred to as tiling has been proposed, in which a plurality of small-area sensor sheets are electrically coupled to obtain a large-area sensor sheet in order to manufacture large-area sensor sheets in high yield (for example, Patent Document 1).

Patent Document 1: Japanese Unexamined Patent Application Publication No. 2016-136612

SUMMARY OF THE INVENTION

According to one aspect of the present invention, there is provided a sensor sheet including a plurality of unit sensor sheets configured to detect a physical property value at multiple points on a sensor layer, each of the plurality of unit sensor sheets including a first substrate, and an electrode layer and the sensor layer sequentially formed on one side of the first substrate included in each of the plurality of unit sensor sheets; and a wiring substrate to which the plurality of unit sensor sheets are configured to be coupled, the wiring substrate including a second substrate, and a plurality of wirings provided on one side of the second substrate included in the wiring substrate, wherein one side of the wiring substrate and one side of each of the plurality of unit sensor sheets are facing each other, and wherein a conductive bonding member configured to electrically couple each of the plurality of unit sensor sheets and the wiring substrate with each other, is included between the electrode layer of each of the plurality of unit sensor sheets and at least one of the plurality of wirings of the wiring substrate.

BRIEF DESCRIPTION OF THE DRAWINGS

FIG. 6 is a cross-sectional view of the sensor sheet according to the first embodiment of the present invention;

FIG. 7 is a cross-sectional view of the sensor sheet when a conductive bump is used for a conductive bonding member according to the first embodiment of the present invention;

FIG. 16 is a cross-sectional view of the wiring sheet according to the third embodiment of the present invention;

FIG. 17 is an explanatory diagram of a unit sensor sheet according to a fourth embodiment of the present invention;

DETAILED DESCRIPTION OF THE PREFERRED EMBODIMENTS

Figure 1:
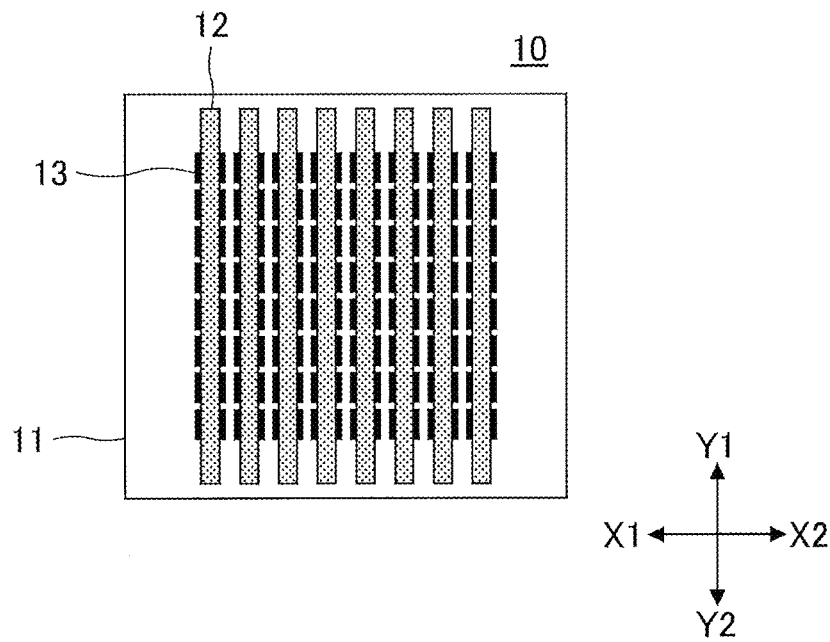
FIG. 1 is an explanatory diagram of a unit sensor sheet according to a first embodiment of the present invention.

In a method of electrically coupling a plurality of small-area sensor sheets to obtain a large-area sensor sheet, coupling members are provided at adjacent portions between adjacent small-area sensor sheets to provide electrical continuity between the adjacent small-area sensor sheets, and the required number of coupling members corresponds to the number of adjacent portions, resulting in a large number of components. Further, the coupling member is provided at the coupling portion where two sensor sheets are coupled, and depending on the strength of the coupling member, or when a force is applied to the coupling portion between the coupling member and the sensor sheet, stress is concentrated at the coupling portion, and, therefore, the reliability of the coupling member is reduced.

For this reason, there is a need for a highly reliable sensor sheet that is obtained by electrically coupling a plurality of small-area sensor sheets to each other.

Embodiments of the present invention are described below. Descriptions of the same members and the like shall be omitted by applying the same reference numerals. In the present specification, the X1-X2 direction, the Y1-Y2 direction, and the Z1-Z2 direction are orthogonal to each other, respectively. Further, a plane including the X1-X2 direction and the Y1-Y2 direction is described as an XY plane, a plane including the Y1-Y2 direction and the Z1-Z2 direction is described as a YZ plane, and a plane including the Z1-Z2 direction and the X1-X2 direction is described as a ZX plane.

First Embodiment

A sensor sheet according to the first embodiment will be described according to FIGS. 1 to 6. The sensor sheet according to the present embodiment is formed by a plurality of unit sensor sheets 10 and a wiring substrate 20.

Figure 2:
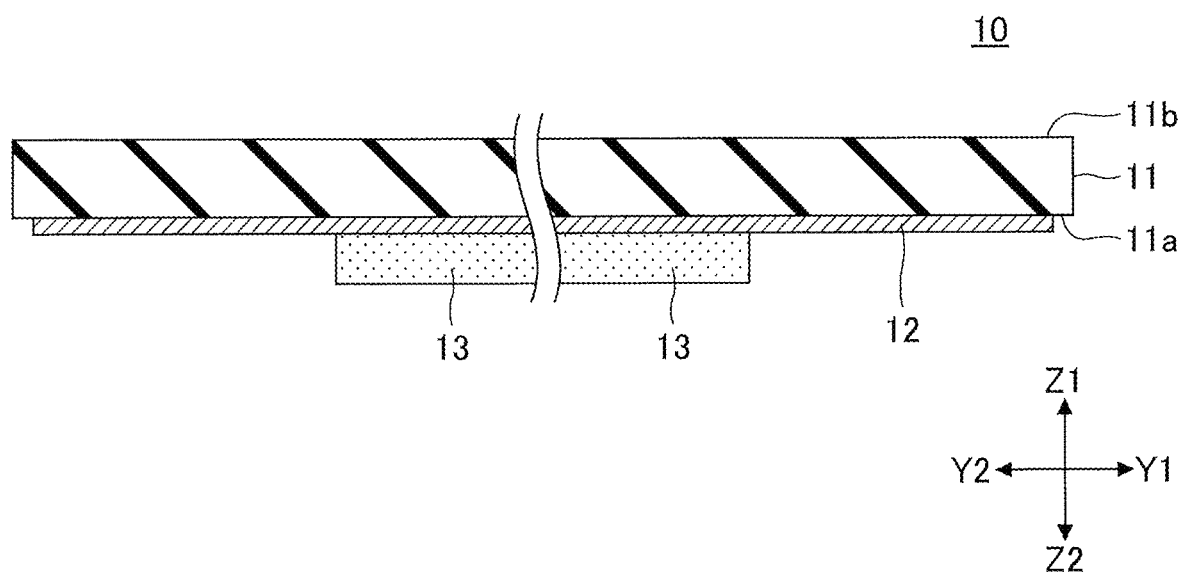
FIG. 2 is a cross-sectional view of the unit sensor sheet according to the first embodiment of the present invention.

As illustrated in FIGS. 1 and 2, the unit sensor sheet 10 has a plurality of Y-electrode layers 12 formed longitudinally along the Y1-Y2 direction, on one side 11a, which is the Z2 side of a substrate 11 that has a square or rectangular shape, and the plurality of the Y-electrode layers 12 are arranged in the X1-X2 direction. FIG. 1 is a top view of the unit sensor sheet 10, which is a transparent view through the substrate 11. FIG. 2 is an enlarged view of a cross-section of the unit sensor sheet 10.

A plurality of sensor layers 13 are formed on the Z2 side of the Y-electrode layers 12. As the sensor layer 13, a material that changes in electrical characteristics (resistance, capacitance, etc.) upon receiving an external stimulus (pressure, heat, light, etc.), is used.

In the unit sensor sheet 10 according to the present embodiment, it is possible to detect external stimuli (pressure, heat, light, etc.) at multiple points.

For example, in the case of a pressure sensor that detects pressure, the sensor layer 13 is formed of a pressure sensitive conductor including an elastic body such as silicone rubber and a plurality of conductive particles such as carbon added to the elastic body. As pressure is applied to the sensor layer 13 for detecting pressure, the resistance of the sensor layer 13 changes as the sensor layer 13 deforms according to the applied pressure. By detecting such change in the resistance value of the sensor layer 13, the pressure applied to the sensor layer 13 can be detected.

In the case of a temperature sensor for detecting temperature, the sensor layer 13 may be formed of a thermistor (negative temperature coefficient (NTC)), a polymer positive temperature coefficient (PTC) and the like made of an inorganic or organic semiconductor. As the temperature in the sensor layer 13 for detecting temperature changes, the resistance value of the sensor layer 13 changes according to the temperature. By detecting such a change in the resistance value of the sensor layer 13, the temperature at the sensor layer 13 can be detected.

The sensor layer 13 need not necessarily be formed separately for each detection point, but the sensor layer 13 may be formed in a continuous manner across the detection points except for the surrounding area.

Figure 3:
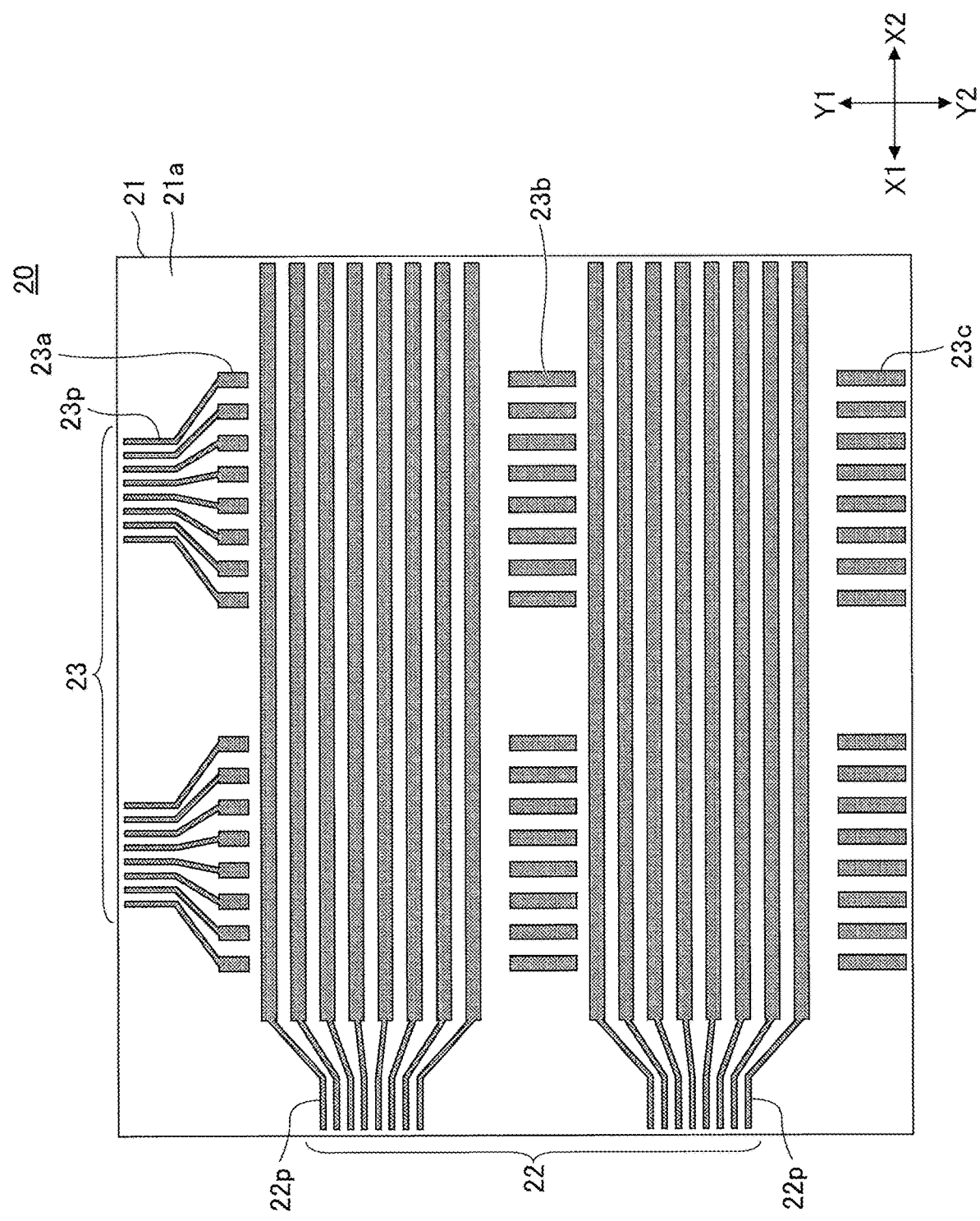
FIG. 3 is a top view of a wiring substrate according to the first embodiment of the present invention.
Figure 4:
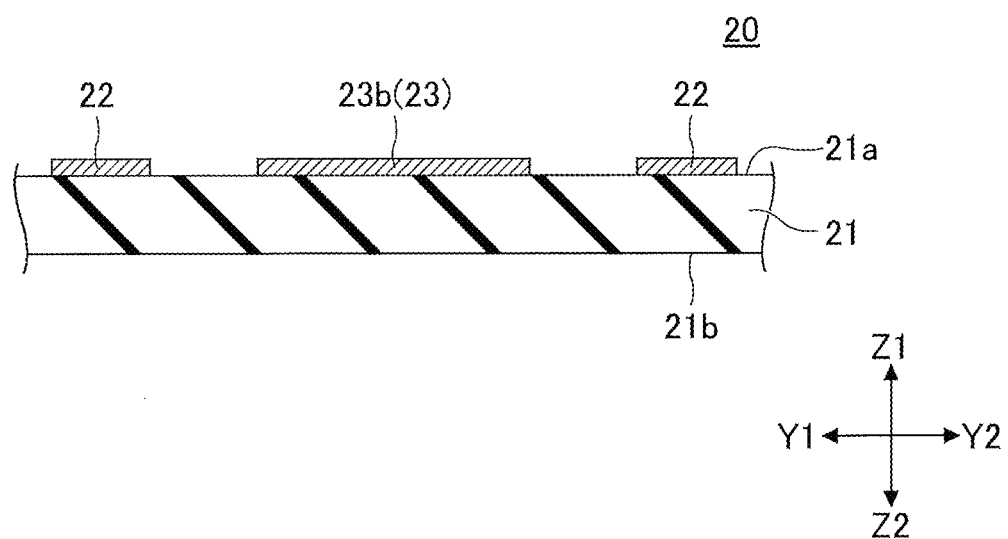
FIG. 4 is a cross-sectional view of the wiring substrate according to the first embodiment of the present invention.

Four of the unit sensor sheets 10 may be coupled to the wiring substrate 20 as illustrated in FIGS. 3 and 4. On the wiring substrate 20, a plurality of X-wiring layers 22, which are formed longitudinally along the X1-X2 direction, are provided on one side 21a on the Z1 side of a substrate 21 of the wiring substrate 20, and the plurality of X-wiring layers 22 are arranged in the Y1-Y2 direction. Further, a plurality of Y-wiring layers 23 are provided along the Y1-Y2 direction to avoid the portions where the X-wiring layers 22 are provided, and the plurality of the Y-wiring layers 23 are arranged in the X1-X2 direction. Each of the Y-wiring layers 23 is separated other at portions intersecting the X-wiring layer 22, and the separated portions of the Y-wiring layer 23 are arranged in the order of a Y-wiring layer 23a, a Y-wiring layer 23b, and a Y-wiring layer 23c, from the Y1 side to the Y2 side. FIG. 3 is a top view of the wiring substrate 20 and FIG. 4 is an enlarged view of a cross-section of the wiring substrate 20. Also, in the present application, "coupling" means an electrically connected state, and, therefore, "coupling the unit sensor sheet" means that the unit sensor sheet is in an electrically connected state.

The substrate 11 and the substrate 21 may be a substrate formed of glass, resin, and the like, but a flexible resin film is preferable. The substrate 11 is formed of a resinous material such as, for example, polyethylene naphthalate (PEN), polyimide, polyethylene terephthalate (PET), and the like having a thickness of 50 μm to 200 μm. The substrate 21 is preferably a stretchable resin film.

The Y-electrode layer 12 of the unit sensor sheet 10, and the X-wiring layer 22 and the Y-wiring layer 23 of the wiring substrate 20 are formed by, for example, printing a conductive paste including silver or copper by screen printing or by ink jet printing and the like, and then sintering the paste. Accordingly, the wiring substrate 20 can be easily manufactured at low cost, even when the area is large.

Figure 5:
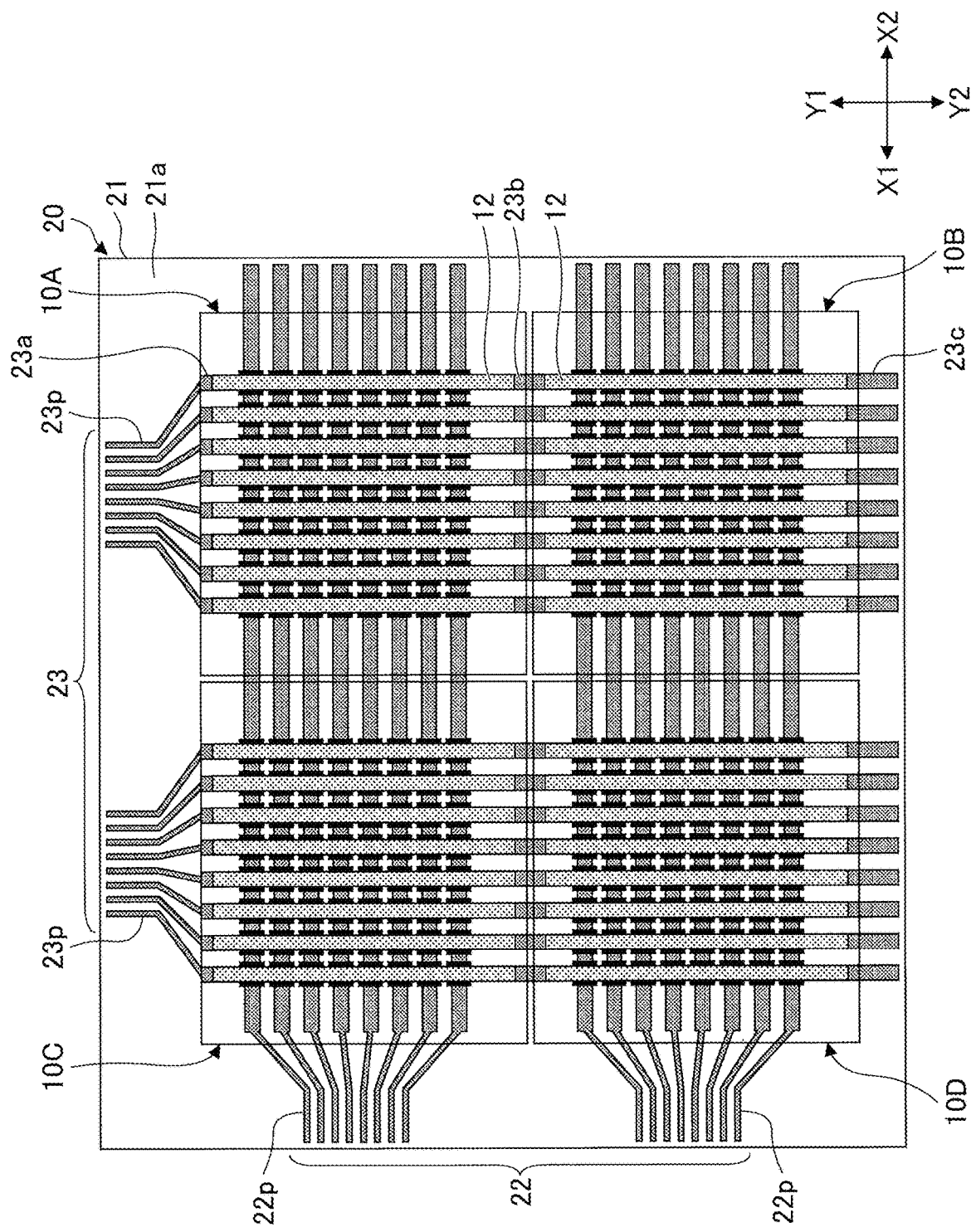
FIG. 5 an explanatory diagram of a sensor sheet according to the first embodiment of the present invention.

FIG. 5 illustrates a sensor sheet according to the present embodiment, in which four unit sensor sheets 10A, 10B, 10C, and 10D are coupled to the wiring substrate 20. The unit sensor sheets 10A, 10B, 10C, and 10D each have the same structure as the unit sensor sheet 10 illustrated in FIGS. 1 and 2. FIG. 6 is an enlarged cross-sectional view of the sensor sheet according to the present embodiment.

In the sensor sheet according to the present embodiment, the one side 11a of the unit sensor sheet 10A and the like on which the Y-electrode layer 12 and the like is provided, and the one side 21a of the wiring substrate 20 on which the Y-wiring layer 23 and the like is provided, are facing each other and are electrically coupled to each other by a conductive bonding member 30. In this state, the sensor layer 13 of the unit sensor sheet 10A and the like and the X-wiring layer 22 of the wiring substrate 20, which are facing each other, are in contact.

Specifically, a portion near the end on the Y2 side of the Y-electrode layer 12, disposed on the one side 11a of the unit sensor sheet 10A, and a portion near the end on the Y1 side of the Y-wiring layer 23b, disposed on the one side 21a of the wiring substrate 20, are bonded to each other by the conductive bonding member 30. Further, a portion near the end on the Y1 side of the Y-electrode layer 12, disposed on the one side 11a of the unit sensor sheet 10B, and a portion near the end on the Y2 side of the Y-wiring layer 23b, disposed on the one side 21a of the wiring substrate 20, are bonded to each other by the conductive bonding member 30. The conductive bonding member 30 is formed of an electrically conductive bonding material such as an anisotropic conductive film (ACF), a conductive bump, or a copper core solder ball.

When conductive bumps or copper core solder balls are used, insulating resin may be provided around these materials to improve the bonding strength. When the sensor layer 13 is a pressure sensitive conductor, it is desirable that the thickness of the conductive bonding member 30 is greater than or equal to the thickness of the sensor layer 13. When the thickness of the conductive bonding member 30 is less than the thickness of the sensor layer 13, there will be adverse effects. As examples of adverse effects, a force will be applied to compress the sensor layer 13 after bonding, and an output value will be detected even in an initial state without applying external pressure (the output value will be background noise), or a restoring force of the sensor layer 13 will act on the bonding portion and reduce the bonding strength, etc. The thickness of a pressure-sensitive conductor is relatively thick, from a few tens of micrometers to a few hundred micrometers, and, therefore, conductive bumps and copper core balls are more suitable than anisotropic conductive films. Conductive bumps are particularly preferable because the manufacturing process is simple.

FIG. 7 is a cross-sectional view of a sensor sheet when a conductive bump is used as a conductive bonding member. When a conductive bump is used as the conductive bonding member 30, a conductive bump 30a is formed on the Y-wiring layer 23b, disposed on the one side 21a of the wiring substrate 20, by screen printing or with a dispenser as illustrated in FIG. 7, and an insulating resin 30b is further applied with a dispenser. Then, the conductive bonding member 30 is affixed and bonded in contact with the Y-electrode layer 12, disposed on the one side 11a of the unit sensor sheet 10A, by thermal pressure bonding. The conductive bump 30a may be formed on the Y-electrode layer 12 on the unit sensor sheet 10A and the like. After the unit sensor sheet 10A and the like and the wiring substrate 20 are pressure bonded to each other via the conductive bump 30a, the insulating resin 30b may applied to the gap between the unit sensor sheets to be diffused and cured around the conductive bump 30a.

Accordingly, the Y-electrode layer 12 of the unit sensor sheet 10A and the Y-electrode layer 12 of the unit sensor sheet 10B are electrically coupled to each other via the Y-wiring layer 23b bonded by the conductive bonding member 30. In the unit sensor sheet 10A and the like, it is possible to detect the magnitude of properties at multiple points at two-dimensional detection points.

When bonded by the conductive bonding member 30, the conductive bonding member 30 is heated, so that the temperature of the portion of the conductive bonding member 30 becomes high and the unit sensor sheet 10A and the like or the wiring substrate 20 may undergo thermal expansion. When the unit sensor sheet 10A and the like and the wiring substrate 20 are formed of materials having different thermal expansion coefficients, positional misalignment may occur between the Y-electrode layer 12 of the unit sensor sheet 10A and the like and the Y-wiring layer 23b of the wiring substrate 20 bonded by the conductive bonding member 30. Therefore, the thermal expansion coefficient of the unit sensor sheet 10A and the like and the thermal expansion coefficient of the wiring substrate 20 are preferably the same, and, therefore, the substrate 11 of the unit sensor sheet 10A and the like and the substrate 21 of the wiring substrate 20 are preferably formed of the same material. Accordingly, when bonding by the conductive bonding member 30, even when the unit sensor sheet 10A and the like and the wiring substrate 20 thermally expand, the Y-electrode layer 12 of the unit sensor sheet 10A and the like and the Y-wiring layer 23b and the like of the wiring substrate 20 can be bonded without positional misalignment occurring therebetween.

Although not illustrated, a portion near the end on the Y1 side of the Y-electrode layer 12, disposed on the one side 11a of the unit sensor sheet 10A, and the Y-wiring layer 23a, disposed on the one side 21a of the wiring substrate 20, are bonded to each other by the conductive bonding member 30. Similarly, a portion near the end on the Y2 side of the Y-electrode layer 12, disposed on the one side 11a of the unit sensor sheet 10B, and the Y-wiring layer 23c, disposed on the one side 21a of the wiring substrate 20, are bonded to each other by the conductive bonding member 30. Accordingly, the Y-electrode layer 12 of the unit sensor sheet 10A, the Y-electrode layer 12 of the unit sensor sheet 10B, and the Y-wiring layers 23a, 23b, and 23c of the wiring substrate 20 are electrically coupled to form a Y-wiring layer along the Y1-Y2 direction. The unit sensor sheets 10C and 10D are similarly coupled to the wiring substrate 20 by the conductive bonding member 30.

In the sensor sheet according to the present embodiment, an electrode pad 22p of the X-wiring layer 22 is provided at the end portion of the wiring substrate 20 on the X1 side illustrated in FIG. 5, and a flexible printed circuit board (FPC) (not illustrated) is coupled to the electrode pad 22p. An electrode pad 23p of the Y-wiring layer 23 is provided at the end portion of the wiring substrate 20 on the Y1 side, and a flexible printed circuit board (not illustrated) is coupled to the electrode pad 23p. These flexible circuit boards are coupled to a driving circuit (not illustrated) that drives the sensor sheet of the present embodiment.

In the sensor sheet according to the present embodiment, all detection points are arranged in a matrix by the unit sensor sheets 10A, 10B, 10C, and 10D coupled to the wiring substrate 20. Therefore, for example, two-dimensional data at all detection points can be acquired by detecting the signal of the Y-wiring layer 23 (line sequential drive) while selection signals are sequentially applied to the X-wiring layer 22. Specifically, the sensor sheet is disposed such that another side 21b of the wiring substrate 20 is positioned at the bottom, and another side 11b of the unit sensor sheet 10A and the like is positioned at the top, and the detection target object (object to be detected) is placed on the other side 11b of the unit sensor sheet 10A and the like. By the detection target object that is placed in this manner, the sensor layer 13 on the unit sensor sheet 10A and the like is deformed, and the change in resistance caused by this deformation is read as a current value, so that the current value can be detected as an AD converted digital signal.

In the present embodiment, by providing one wiring substrate 20, there is no need to provide coupling members for each coupling portion between a unit sensor sheet and a unit sensor sheet, so that the number of components can be reduced and the sensor sheet can be provided at low cost. Also, when manufacturing the sensor sheet, there is no need to form a through-hole and the like through the substrate, thereby simplifying the manufacturing process. Furthermore, each unit sensor sheet is coupled to and disposed on a wiring substrate, and, therefore, even when a force is applied to the sensor sheet, the stress is not concentrated at a specific portion, and thus reliability is high.

Modified Example (First Embodiment)

Figure 8:
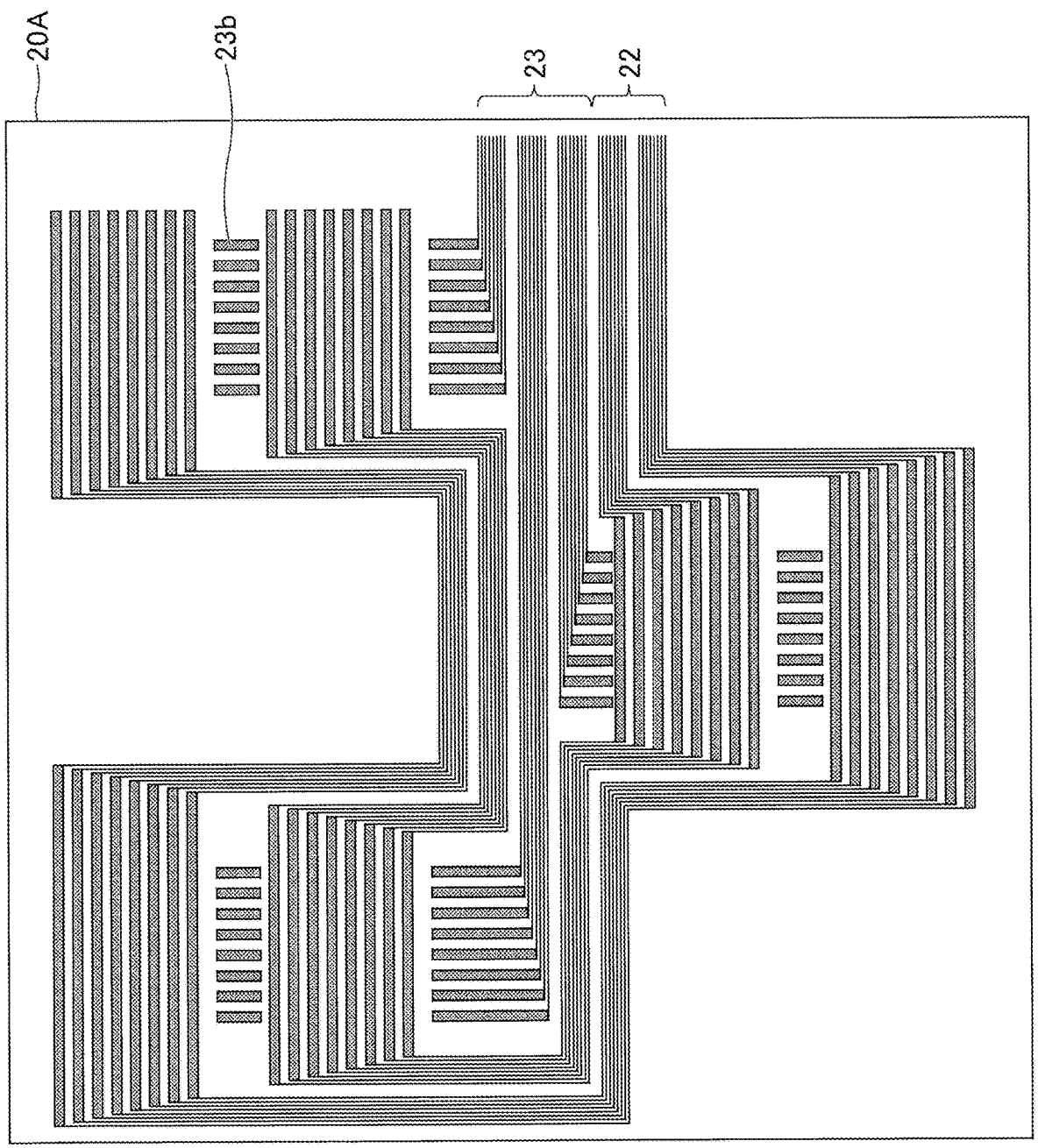
FIG. 8 is an explanatory diagram (1) of a modified example of the sensor sheet according to the first embodiment of the present invention.

Next, a modified example of the sensor sheet according to the present embodiment will be described. The sensor sheet according to the present embodiment may be anisotropic shaped, with the X-wiring layer 22 and the Y-wiring layer 23 being drawn around, as illustrated in FIG. 8. On the wiring substrate of this sensor sheet, the X-wiring layer 22 has a portion extending not only the X1-X2 direction but also the Y1-Y2 direction, and the Y-wiring layer 23 has a portion extending not only the Y1-Y2 direction but also the X1-X2 direction. Even in the case of the X-wiring layer 22 and the Y-wiring layer 23 described above, the intersection of the X-wiring layer 22 and the Y-wiring layer 23 forms a matrix by drawing around the wiring, and, therefore, it is possible to drive the sensor sheet by the line sequential driving.

Figure 9:
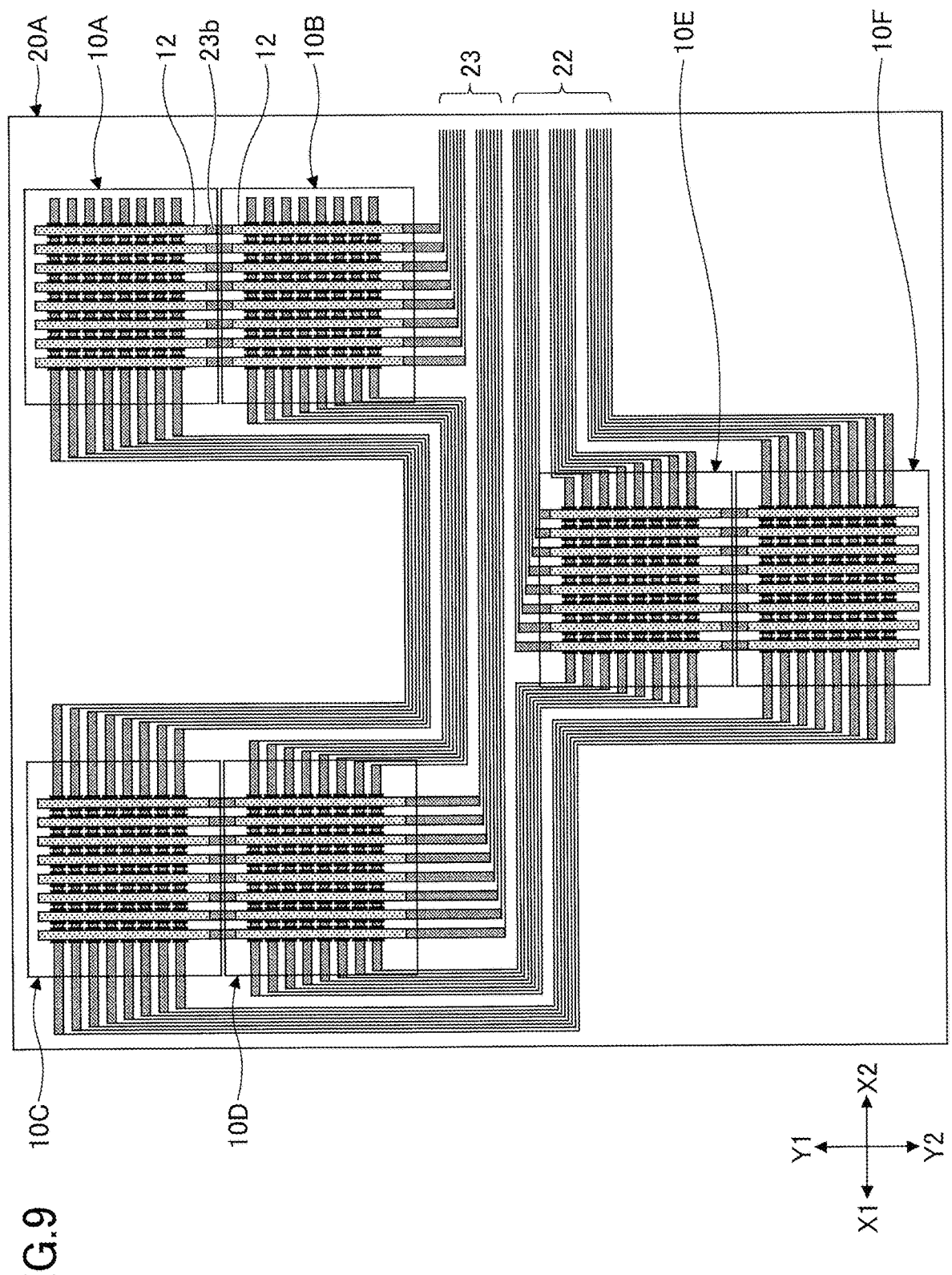
FIG. 9 is an explanatory diagram (2) of a modified example of the sensor sheet according to the first embodiment of the present invention.
Figure 10:
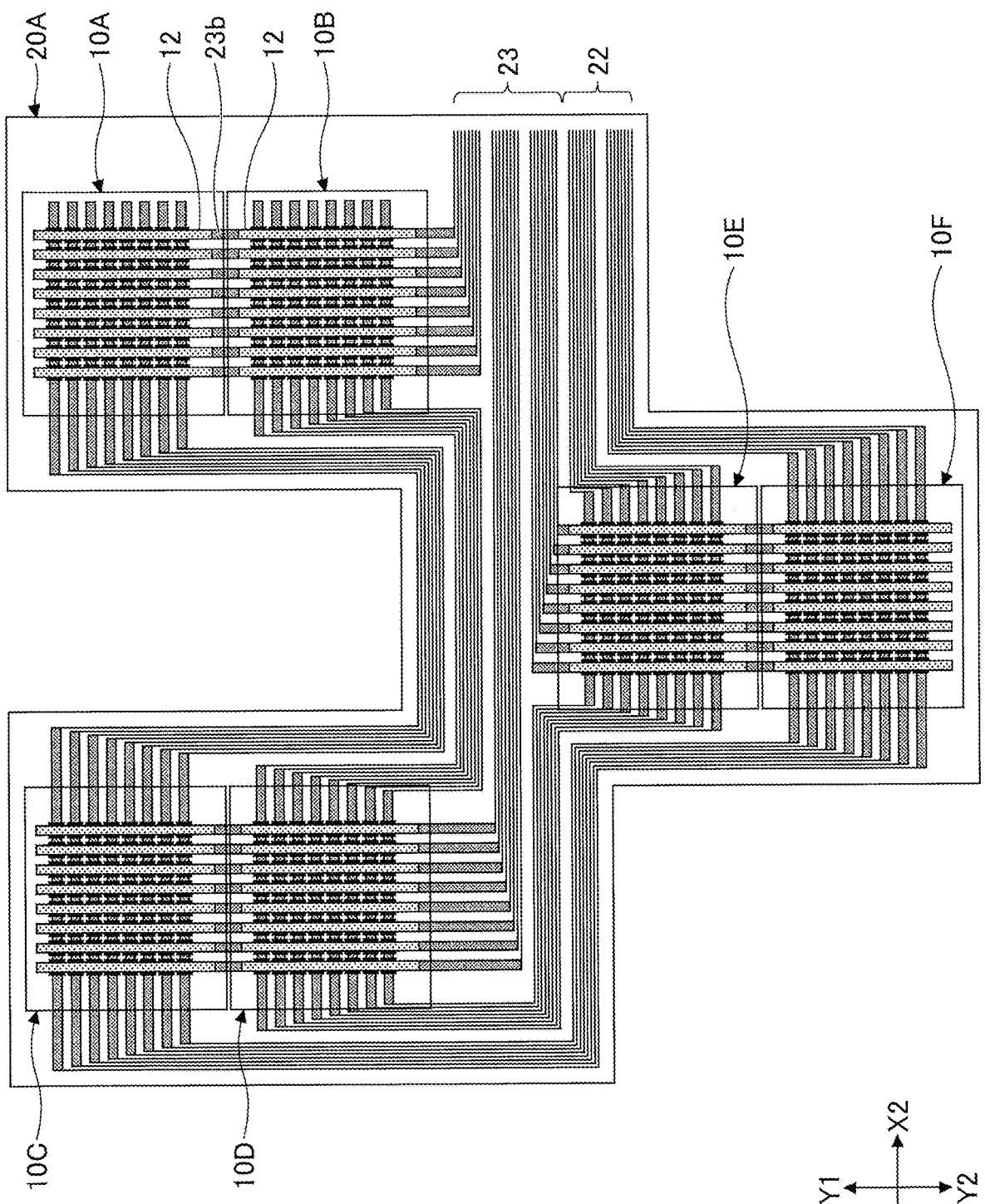
FIG. 10 is an explanatory diagram (3) of a modified example of the sensor sheet according to the first embodiment of the present invention.

The sensor sheet according to the present modification of the first embodiment is formed by preparing a wiring substrate 20A having the structure illustrated in FIG. 8 and coupling the unit sensor sheets 10A, 10B, 10C, 10D, 10E, and 10F at predetermined positions on the wiring substrate 20A as illustrated in FIG. 9. Thereafter, as illustrated in FIG. 10, unnecessary portions of the wiring substrate 20A are cut off to obtain a sensor sheet of the desired shape.

In the present modified example, on the wiring substrate 20A, it is preferable that an insulating film (not illustrated) is formed at portions other than the portions to which the unit sensor sheets 10A to 10F are coupled, where the X-wiring layer 22 and the Y-wiring layer 23 are exposed.

Second Embodiment

Figure 11:
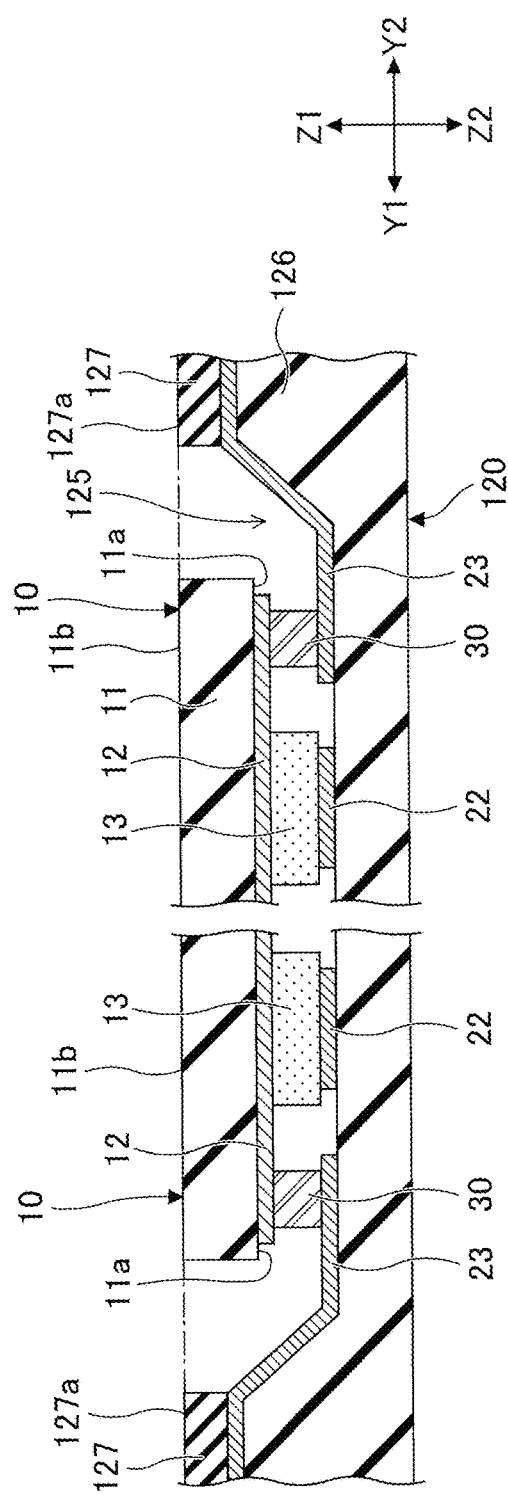
FIG. 11 is a cross-sectional view of a sensor sheet according to a second embodiment of the present invention.

Next, a sensor sheet according to a second embodiment will be described. As illustrated in FIG. 11, the sensor sheet according to the present embodiment has a structure in which a recessed portion 125 is provided in a region in which the unit sensor sheet 10 is disposed in a wiring substrate 120. For example, when a plurality of the unit sensor sheets 10 are coupled to the wiring substrate 120, and the unit sensor sheets 10 are separated from each other, the portions where the unit sensor sheets 10 are coupled have a high height, and the portions where the unit sensor sheets 10 are not coupled have a low height, resulting in irregularities. When there are such irregularities, and a measurement target object is placed on the sensor sheet, the contact state between the measurement target object and the sensor sheet will be uneven depending on the position of the sensor sheet, and the force applied to the unit sensor sheet 10 will vary.

In the present embodiment, in the wiring substrate 120, the recessed portion 125 having a shape that is slightly wider than the unit sensor sheet 10, is formed in a region in which the unit sensor sheet 10 is disposed, and the unit sensor sheet 10 is bonded to a predetermined region of the recessed portion 125 by the conductive bonding member 30. A protruding portion 126 is formed around the recessed portion 125, and on the protruding portion 126, the Y-wiring layer 23 formed on the substrate and an insulating film 127 formed on the Y-wiring layer 23, are formed. This allows a surface 127a of the insulating film 127 at the protruding portion 126 and the other side 1ib of the unit sensor sheet 10 to be flush with each other and to be of the same height. In the present application, the portion formed by the protruding portion 126, the Y-wiring layer 23 formed on the protruding portion 126, and the insulating film 127, may be described as the protruding portion.

Accordingly, the portion where the unit sensor sheet 10 is coupled and the portion where the unit sensor sheet 10 is not coupled can be made to have the same height, thus preventing a difference in the force applied to the unit sensor sheet 10 depending on the position where the measurement target object is placed on the sensor sheet. In FIG. 11, the Y1-Y2 direction is illustrated, but the same applies to the X1-X2 direction. Accordingly, this configuration prevents an unevenness in the contact state depending on the position of the measurement target object when the measurement target object is placed on the sensor sheet, and improves detection accuracy.

In the present embodiment, the surface of the wiring substrate 120 has irregularities, and, therefore, when forming the X-wiring layer 22 and the Y-wiring layer 23 on the wiring substrate 120, a printing method such as an inkjet method in which ink for forming the X-wiring layer 22 and the Y-wiring layer 23 is applied in a non-contact manner, is preferable.

Figure 12:
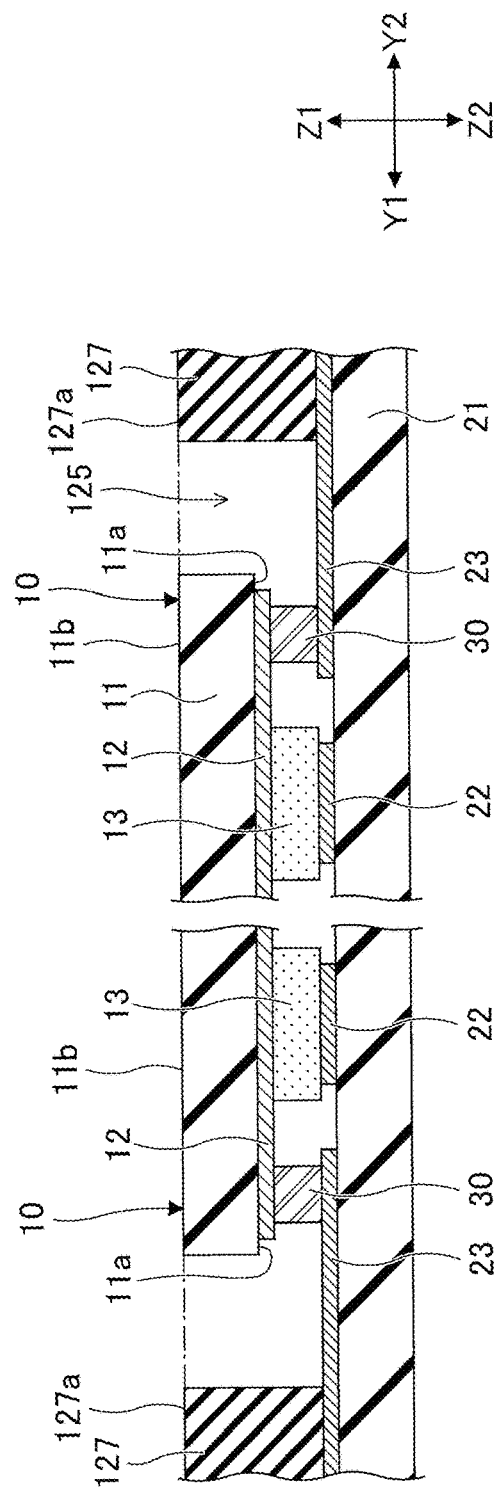
FIG. 12 is a cross-sectional view of a modified example of the sensor sheet according to the second embodiment of the present invention.

As illustrated in FIG. 12, the wiring substrate according to the present embodiment may be formed by forming the X-wiring layer 22 and the Y-wiring layer 23 on the substrate 21 having no irregularities similar to the first embodiment, and further thickening the insulating film 127 formed around the region where the unit sensor sheet 10 is disposed. Even in such a case, the other side 11b of the unit sensor sheet 10 and the surface 127a of the insulating film 127 can be made to have the same height.

The contents other than the above are the same as those of the first embodiment.

Third Embodiment

Next, a third embodiment will be described with reference to FIGS. 13 and 14. In the present embodiment, for example, a sensor sheet has a structure in which a wiring sheet 110 that serves as a dummy is disposed, instead of some of the unit sensor sheets 10, on the wiring substrate 20 according to the first embodiment. Specifically, in a region where the unit sensor sheet 10 is disposed on the wiring substrate 20, there may be a region that does not need to be detected, that is, a region that does not require the unit sensor sheet 10. In this case, if the unit sensor sheet 10 and the like is not disposed, the Y-wiring layer 23 remains separated at that portion, and thus the signal of the unit sensor sheet 10 cannot be read. In the present embodiment, in order to avoid this situation, when there is a region where the unit sensor sheet 10 is unnecessary, the wiring sheet 110 that serves as a dummy is disposed instead of the unit sensor sheet 10.

Figure 15:
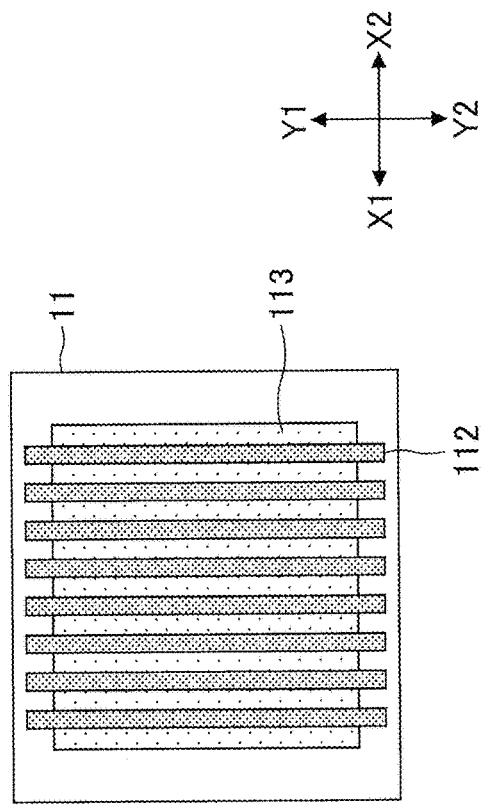
FIG. 15 is an explanatory diagram of a wiring sheet according to the third embodiment of the present invention.

FIGS. 15 and 16 illustrate the wiring sheet 110 according to the present embodiment. The wiring sheet 110 includes a plurality of Y-coupling wiring layers 112 that are formed longitudinally along the Y1-Y2 direction on the one side 11a that is the Z2 side of the substrate 11 having the same size as the unit sensor sheet 10, and the plurality of the Y-coupling wiring layers 112 are arranged in the X1-X2 direction. FIG. 15 is a top view of the wiring sheet 110, which is a transparent view through the substrate 11, and FIG. 16 is an enlarged view of a cross-section of the wiring sheet 110. Further, an insulating film 113 is formed in a region other than the ends on the Y1 side and the Y2 side of the Y-coupling wiring layer 112, and the Y-coupling wiring layer 112 is covered by the insulating film 113.

Figure 13:
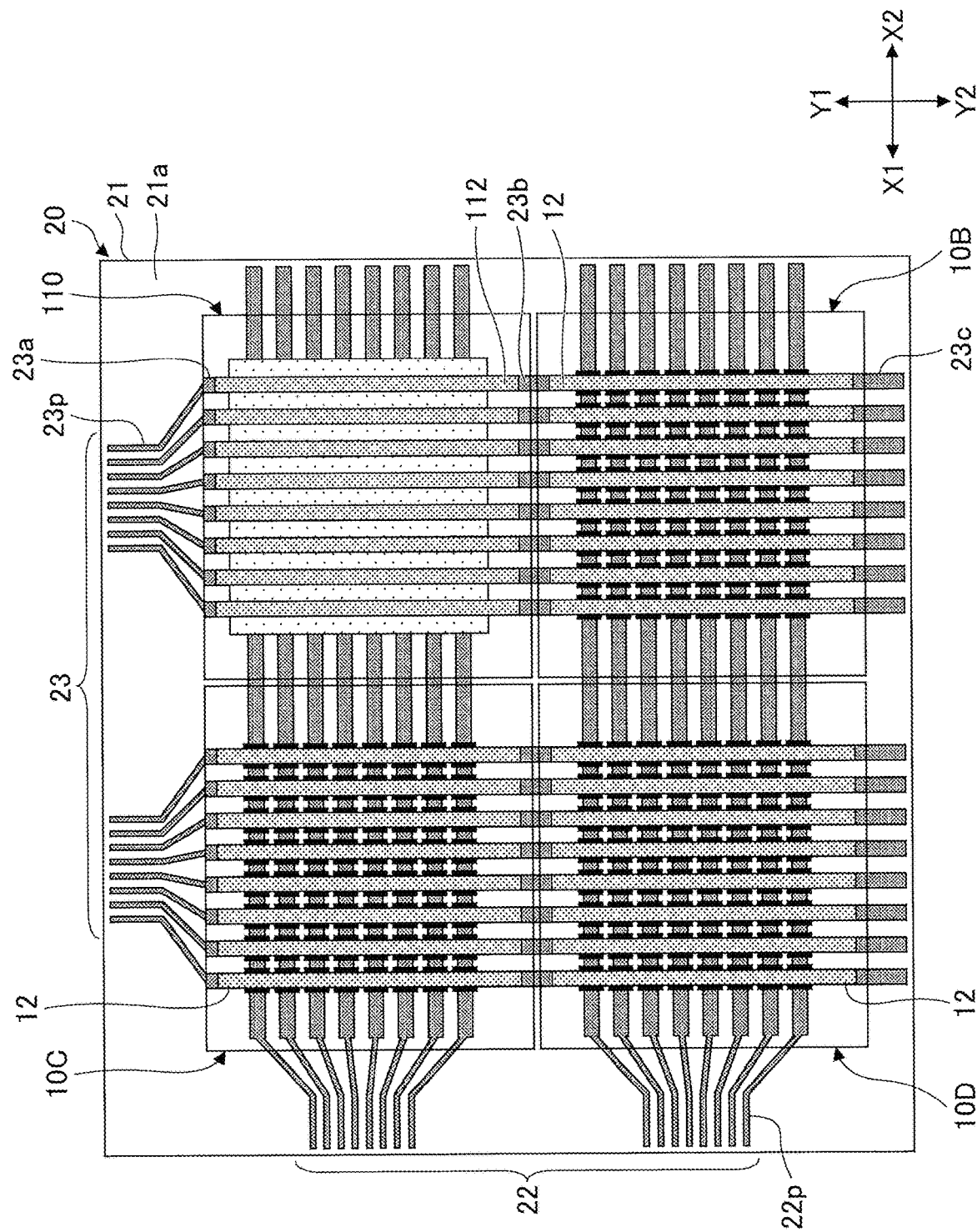
FIG. 13 is an explanatory diagram of a sensor sheet according to a third embodiment of the present invention.

As illustrated in FIG. 13, in the sensor sheet according to the present embodiment, the three unit sensor sheets 10B, 10C, and 10D and the wiring sheet 110 serving as a dummy are coupled to the wiring substrate 20.

Figure 14:
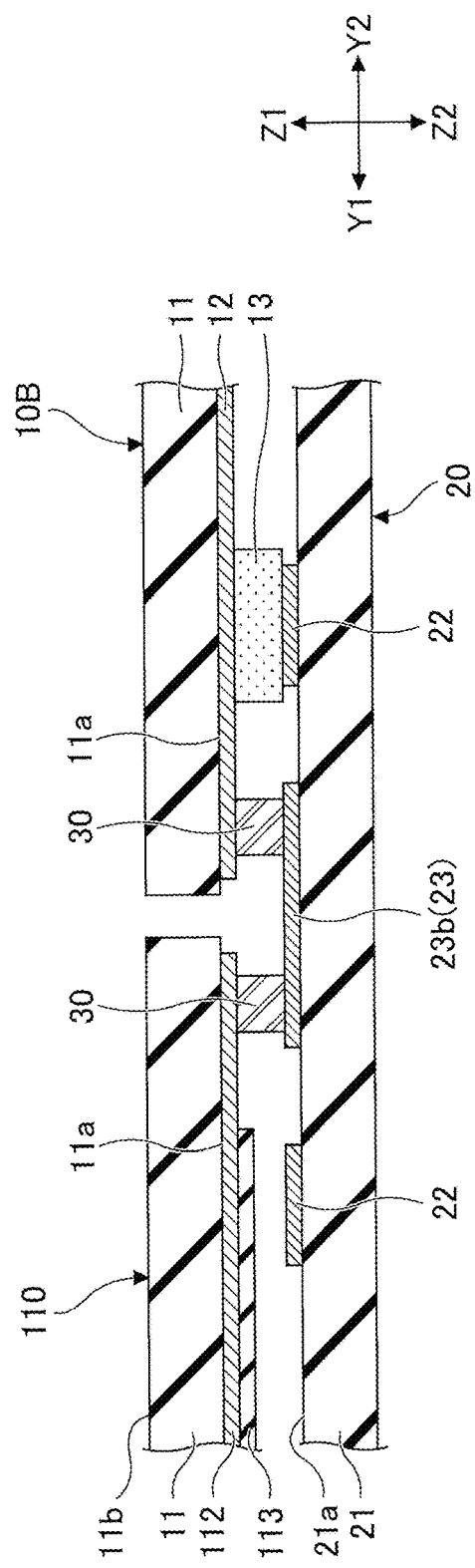
FIG. 14 is a cross-sectional view of the sensor sheet according to the third embodiment of the present invention.

FIG. 14 is an enlarged cross-sectional view of the sensor sheet according to the present embodiment. In the sensor sheet according to the present embodiment, the one side 11a of the wiring sheet 110 on which the Y-coupling wiring layer 112 is provided, and the one side 21a of the wiring substrate 20 on which the Y-wiring layer 23 and the like is provided, are facing each other and are electrically coupled to each other by the conductive bonding member 30. Also, the one side 11a of the unit sensor sheet 10B on which the Y-electrode layer 12 and the like is provided, and the one side 21a of the wiring substrate 20 on which the Y-wiring layer 23 and the like is provided, are facing each other and are electrically coupled to each other by a conductive bonding member 30.

Specifically, a portion near the end on the Y2 side of the Y-coupling wiring layer 112, disposed on the one side 11a of the wiring sheet 110, and a portion near the end on the Y1 side of the Y-wiring layer 23b, disposed on the one side 21a of the wiring substrate 20, are bonded to each other by the conductive bonding member 30. Further, a portion near the end on the Y1 side of the Y-electrode layer 12, disposed on the one side 11a of the unit sensor sheet 10B, and a portion near the end on the Y2 side of the Y-wiring layer 23b, disposed on the one side 21a of the wiring substrate 20, are bonded to each other by the conductive bonding member 30. Accordingly, the Y-coupling wiring layer 112 of the wiring sheet 110 and the Y-electrode layer 12 of the unit sensor sheet 10B are electrically coupled to each other via the Y-wiring layer 23b bonded by the conductive bonding member 30.

Although not illustrated, a portion near the end on the Y1 side of the Y-coupling wiring layer 112, disposed on the one side 11a of the wiring sheet 110, and the Y-wiring layer 23a, disposed on the one side 21a of the wiring substrate 20, are bonded to each other by the conductive bonding member 30. Similarly, a portion near the end on the Y2 side of the Y-electrode layer 12, disposed on the one side 11a of the unit sensor sheet 10B, and the Y-wiring layer 23c, disposed on the one side 21a of the wiring substrate 20, are bonded to each other by the conductive bonding member 30. Accordingly, the Y-coupling wiring layer 112 of the wiring sheet 110, the Y-electrode layer 12 of the unit sensor sheet 10B, and the Y-wiring layers 23a, 23b, and 23c of the wiring substrate 20 are electrically coupled to form a Y-wiring layer along the Y1-Y2 direction.

As described above, in the present embodiment, when a region in which the unit sensor sheet 10 is unnecessary exists in the wiring substrate 20, the wiring sheet 110 that serves as a dummy is disposed instead of the unit sensor sheet 10, so that the signal transmission in the sensor sheet is smoothly performed.

The contents other than the above are the same as those of the first embodiment.

Fourth Embodiment

Next, a sensor sheet according to the fourth embodiment will be described with reference to FIGS. 17 to 24. The sensor sheet according to the present embodiment is formed by a plurality of unit sensor sheets 210 and a wiring substrate 220.

Figure 18:
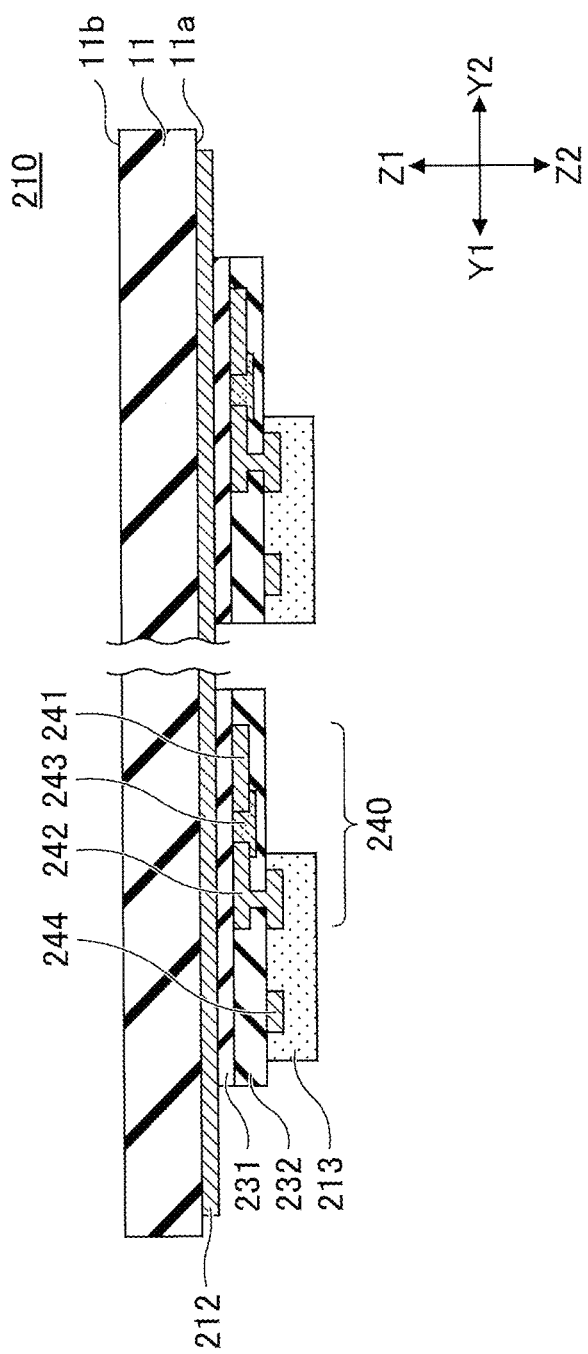
FIG. 18 is a cross-sectional view of a unit sensor sheet according to the fourth embodiment of the present invention.

The unit sensor sheet 210 will be described with reference to FIGS. 17 and 18. FIG. 17 is a top view of the unit sensor sheet 210, which is a transparent view through the substrate 11, and FIG. 18 is an enlarged view of a cross-section of the unit sensor sheet 210. The unit sensor sheet 210 has thin film transistors provided at the respective detection points on the one side 11a of the square or rectangular substrate 11 on the Z2 side. Specifically, on the one side 11a of the unit sensor sheet 210, a plurality of gate electrodes 212 are formed longitudinally along the Y1-Y2 direction, and the plurality of the gate electrodes 212 are arranged in the X1-X2 direction. A gate insulating film 231 is formed on the Z2 side of the gate electrode 212. A source electrode 241 and a drain electrode 242 are formed on the Z2 side of the gate insulation film 231 at each detection point, and a semiconductor layer 243 is formed between the source electrode 241 and the drain electrode 242.

On the Z2 side of the source electrode 241 and the semiconductor layer 243, an insulating film 232 is formed, and on the Z2 side of the insulating film 232, the drain electrode 242 penetrating the insulating film 232 and a common electrode 244 are formed. A sensor layer 213 is provided to cover the drain electrode 242 and the common electrode 244, and the common electrode 244 is coupled, by a coupling member, to a common wiring (not illustrated) provided on the wiring substrate 220.

In the present embodiment, a thin film transistor 240 is formed by the gate electrode 212, the gate insulating film 231, the source electrode 241, the drain electrode 242, the semiconductor layer 243, and the like. The gate electrode 212 also serves as a Y-wiring layer, and the source electrode 241 also serves as an X-wiring layer formed longitudinally along the direction X1-X2.

Although the thin film transistor described above has a bottom-gate/bottom-contact type structure, the thin film transistor may have a top-gate/bottom-contact type structure.

Figure 19:
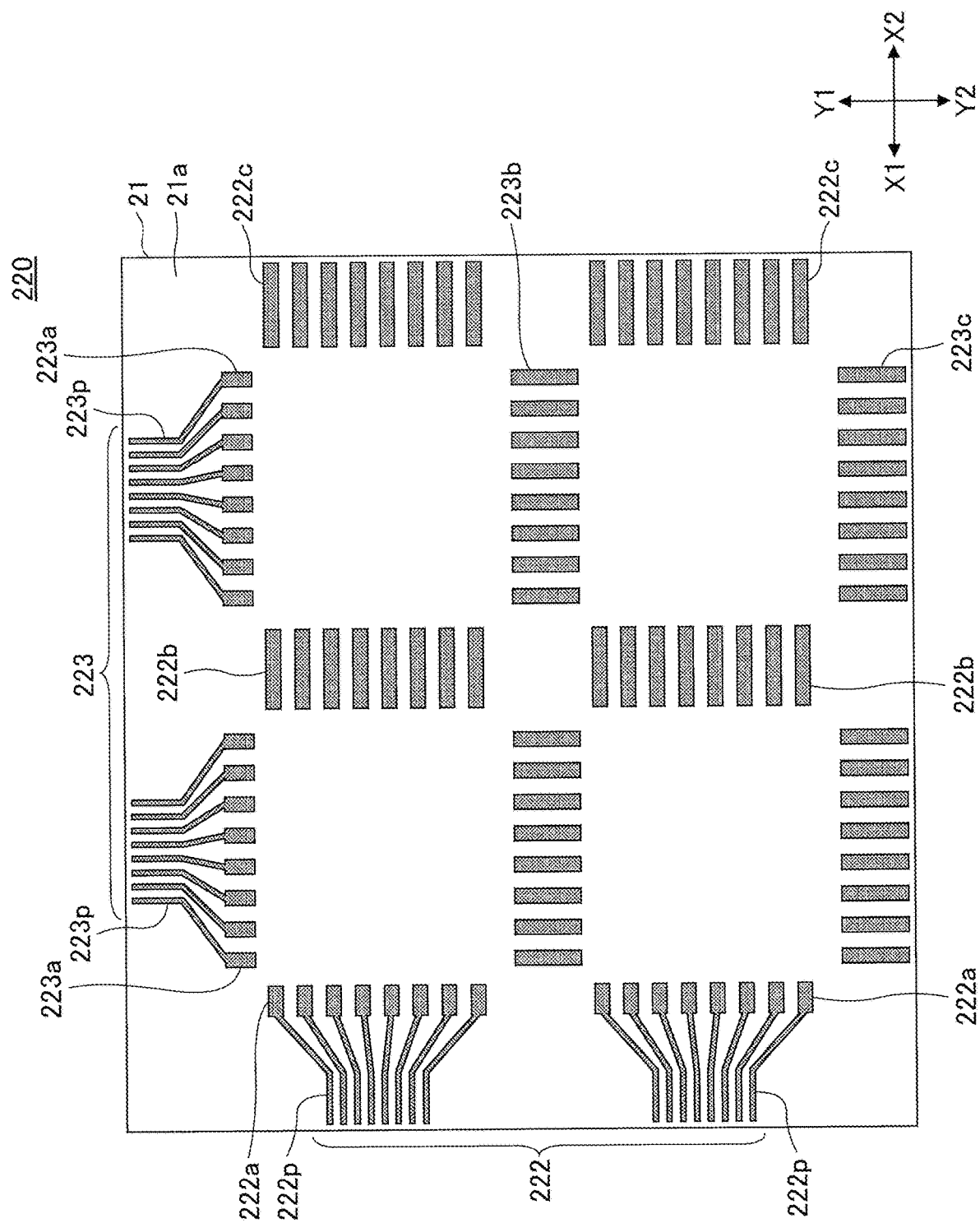
FIG. 19 is a top view of a wiring substrate according to the fourth embodiment of the present invention.

FIG. 19 is a top view of the wiring substrate 220 in the fourth embodiment. As illustrated in FIG. 19, the four unit sensor sheets 210 can be coupled to wiring substrate 220. On the wiring substrate 220, an X-wiring layer 222 formed along the X1-X2 direction is provided on the one side 21a that is the Z1 side of the substrate 21 of the wiring substrate 220, and a plurality of Y-wiring layers 223 are arranged in the Y1-Y2 direction. The X-wiring layer 222 and the Y-wiring layer 223 are separated at portions that are on the inner side respect to the portions where the unit sensor sheet 210 is disposed.

The respective separated portions of the X-wiring layer 222 are disposed in the order of an X-wiring layer 222a, an X-wiring layer 222b, and an X-wiring layer 222c, from the X1 side to the X2 side. The respective separated portions of the Y-wiring layer 223 are disposed in the order of a Y-wiring layer 223a, a Y-wiring layer 223b, and a Y-wiring layer 223c, from the Y1 side to the Y2 side. FIG. 19 is a top view of the wiring substrate 220.

Figure 20:
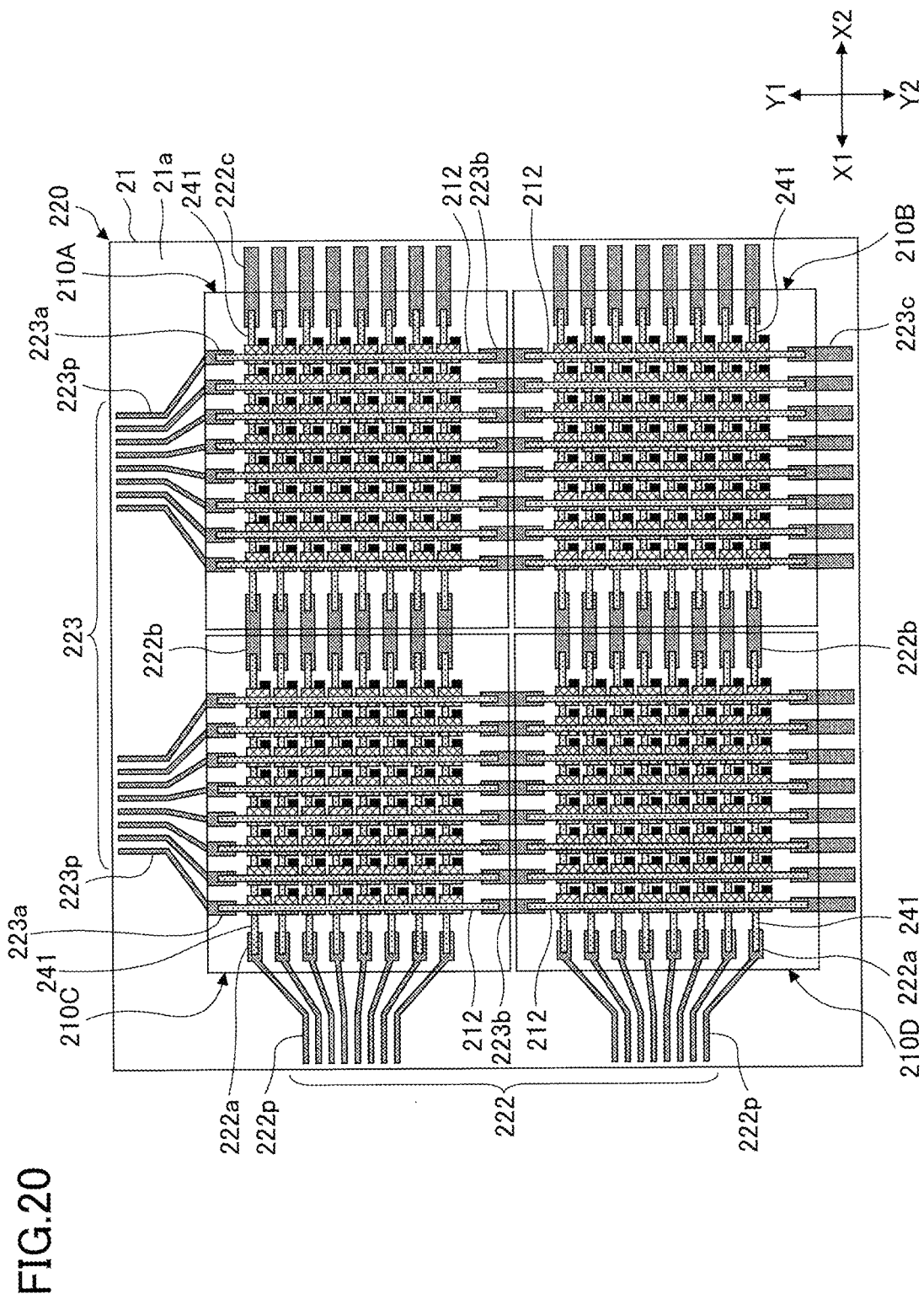
FIG. 20 is an explanatory diagram of a sensor sheet according to the fourth embodiment of the present invention.

FIG. 20 illustrates the sensor sheet according to the present embodiment and illustrates a state in which four unit sensor sheets 210A, 210B, 210C, and 210D are coupled to the wiring substrate 220. The unit sensor sheets 210A, 210B, 210C, and 210D have the same structure as the unit sensor sheet 210 illustrated in FIGS. 17 and 18.

Figure 24:
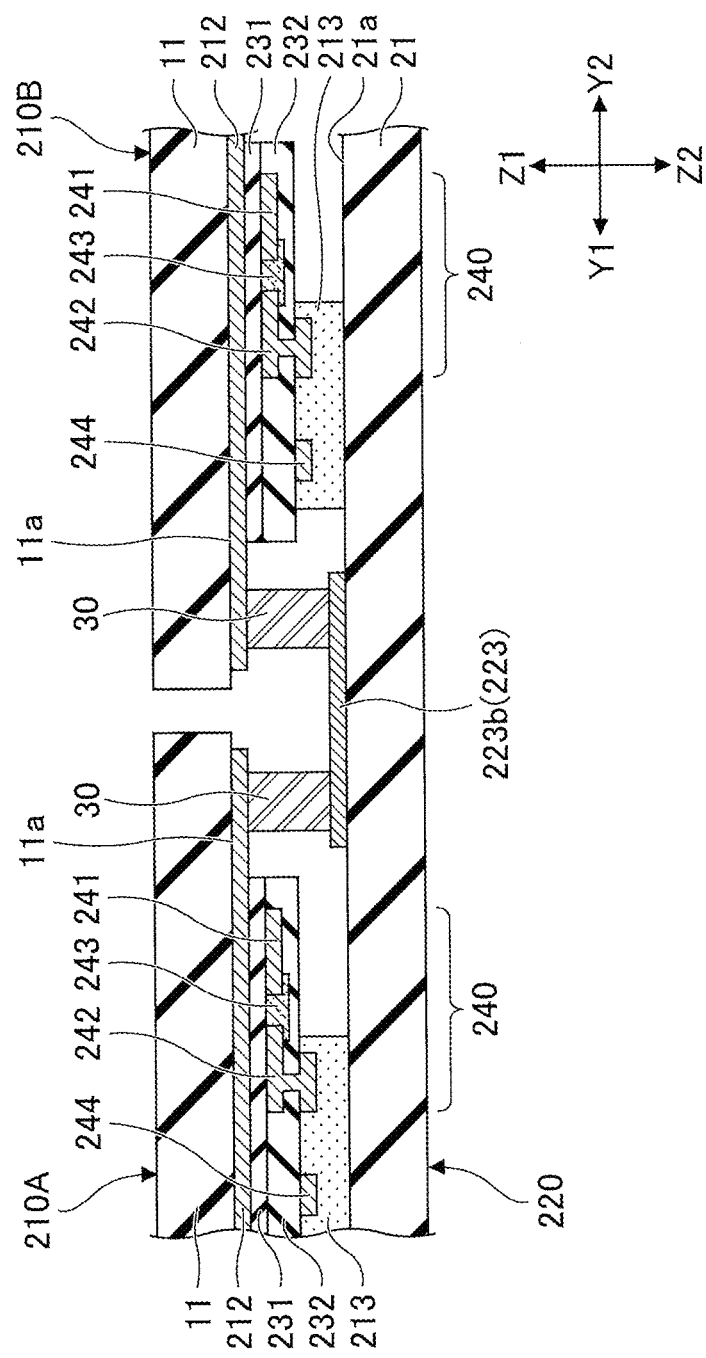
FIG. 24 is a cross-sectional view of a sensor sheet according to the fourth embodiment of the present invention.

FIG. 24 is an enlarged cross-sectional view of the sensor sheet according to the present embodiment. In the sensor sheet according to the present embodiment, the one side 11a of the unit sensor sheet 210A on which the gate electrode 212 is provided, and the one side 21a of the wiring substrate 220 on which the Y-wiring layer 223 is provided, are facing each other and are electrically coupled to each other by the conductive bonding member 30.

Specifically, a portion near the end on the Y2 side of the gate electrode 212, disposed on the one side 11a of the unit sensor sheet 210A, and a portion near the end on the Y1 side end of the Y-wiring layer 223b, disposed on the one side 21a of the wiring substrate 220, are bonded to each other by the conductive bonding member 30. Further, a portion near the end on the Y1 side of the gate electrode 212, disposed on the one side 11a of the unit sensor sheet 210B, and a portion near the end on the Y2 side of the Y-wiring layer 223b, disposed on the one side 21a of the wiring substrate 220, are bonded to each other by the conductive bonding member 30. Accordingly, the gate electrode 212 of the unit sensor sheet 210A and the gate electrode 212 of the unit sensor sheet 210B are electrically coupled to each other via the Y-wiring layer 223b bonded by the conductive bonding member 30. It is preferable that the substrate 11 of the unit sensor sheet 210A and the like and the substrate 21 of the wiring substrate 220 are formed of the same material.

Further, although not illustrated, a portion near the end on the Y1 side of the gate electrode 212, disposed on the one side 11a of the unit sensor sheet 210A, and the Y-wiring layer 223a, disposed on the one side 21a of the wiring substrate 220, are bonded to each other by the conductive bonding member 30. Similarly, a portion near the end on the Y2 side of the gate electrode 212, disposed on the one side 11a of the unit sensor sheet 210B, and the Y-wiring layer 223c, disposed on the one side 21a of the wiring substrate 220, are bonded to each other by the conductive bonding member 30. Accordingly, the gate electrode 212 of the unit sensor sheet 210A, the gate electrode 212 of the unit sensor sheet 210B, and the Y-wiring layers 223a, 223b, and 223c of the wiring substrate 220 are electrically coupled to form a Y-wiring layer along the Y1-Y2 direction. The unit sensor sheets 210C, 210D are similarly coupled to the wiring substrate 220 by the conductive bonding member 30.

Further, although not illustrated, a portion near the end on the X2 side of the source electrode 241, disposed on the one side 11a of the unit sensor sheet 210C, and a portion near the end on the X1 side of the X-wiring layer 222b, disposed on the one side 21a of the wiring substrate 220, are bonded to each other by the conductive bonding member 30. Further, a portion near the end on the X1 side of the source electrode 241, disposed on the one side 11a of the unit sensor sheet 210A, and a portion near the end on the X2 side of the X-wiring layer 222b, disposed on the one side 21a of the wiring substrate 220, are bonded to each other by the conductive bonding member 30. Accordingly, the source electrode 241 of the unit sensor sheet 210C and the source electrode 241 of the unit sensor sheet 210A are electrically coupled to each other via the X-wiring layer 222b bonded by the conductive bonding member 30.

Further, a portion near the end on the X1 side of the source electrode 241, disposed on the one side 11a of the unit sensor sheet 210C, and the X-wiring layer 222a, disposed on the one side 21a of the wiring substrate 220, are bonded to each other by the conductive bonding member 30. A portion near the end on the X2 side of the source electrode 241, disposed on the one side 11a of the unit sensor sheet 210A, and the X-wiring layer 222c, disposed on the one side 21a of the wiring substrate 220, are bonded to each other by the conductive bonding member 30. Accordingly, the source electrode 241 of the unit sensor sheet 210C, the source electrode 241 of the unit sensor sheet 210A, and the X-wiring layers 222a, 222b, and 222c of the wiring substrate 220 are electrically coupled to form an X-wiring layer along the X1-X2 direction. The same applies to the unit sensor sheets 210B and 210D.

The sensor sheet according to the present embodiment can be driven by line sequential driving. Specifically, on the gate electrode 212 which is the Y-wiring layer, when the gate electrode 212 is selected, a gate voltage by which the gate electrode 212 is turned on in the thin film transistor is applied, and when the gate electrode 212 is not selected, a gate voltage by which the gate electrode 212 is turned off in the thin film transistor is applied. To the common electrode 244, a predetermined voltage is applied. Accordingly, the change in the electrical characteristics (e.g., the resistance value) due to the external stimulation in the sensor layer 213 is read, as the source-to-drain current (the current between the source and the drain) of the thin film transistor coupled in series, from the X-wiring layer that is the source electrode 241, and AD conversion is performed to detect the signal value. By providing a thin film transistor, the leakage current at the off-time can be reduced, so that the S/N ratio can be increased, and high-speed, high-precision detection can be performed even when there are a large number of detection points.

Accordingly, in the sensor sheet according to the present embodiment, all detection points are arranged in a matrix, by the unit sensor sheets 210A, 210B, 210C, and 210D coupled to the wiring substrate 20. Therefore, for example, two-dimensional data at all detection points can be acquired by detecting a signal of the Y-wiring layer 223 (line sequential driving) while sequentially applying selection signals to the X-wiring layer 222.

In the sensor sheet according to the present embodiment, an electrode pad 222p of the X-wiring layer 222 is provided at the end of the wiring substrate 220 on the X1 side illustrated in FIG. 20, and a flexible printed circuit board (not illustrated) is coupled to the electrode pad 222p. Similarly, an electrode pad 223p of the Y-wiring layer 223 is provided at the end of the wiring substrate 220 on the Y1 side, and a flexible printed circuit board (not illustrated) is coupled to the electrode pad 223p. These flexible circuit boards are coupled to a driving circuit that drives the sensor sheet in the present embodiment.

The contents other than the above are the same as those of the first embodiment.

Modified Example (Fourth Embodiment)

A modified example of the sensor sheet according to the present embodiment will be described with reference to FIGS. 18, 21, 22, and 23. The sensor sheet according to the modified example of the present embodiment is formed by a plurality of the unit sensor sheets 210A and the wiring substrate 220.

Figure 21:
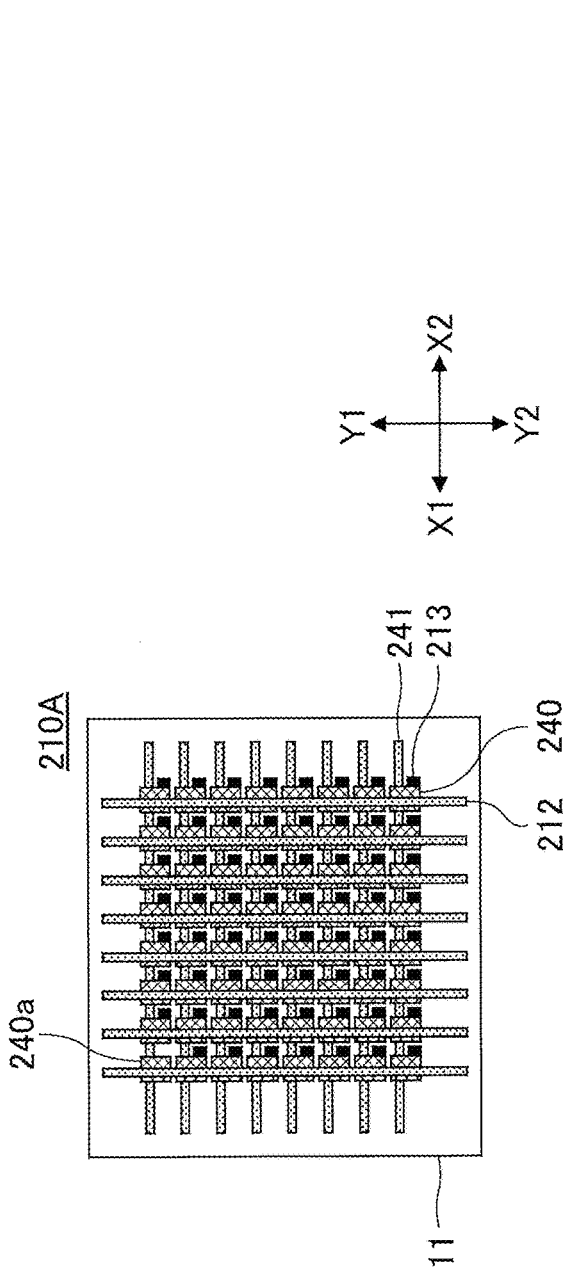
FIG. 21 is an explanatory diagram of a modified example of the unit sensor sheet according to the fourth embodiment of the present invention.
Figure 22:
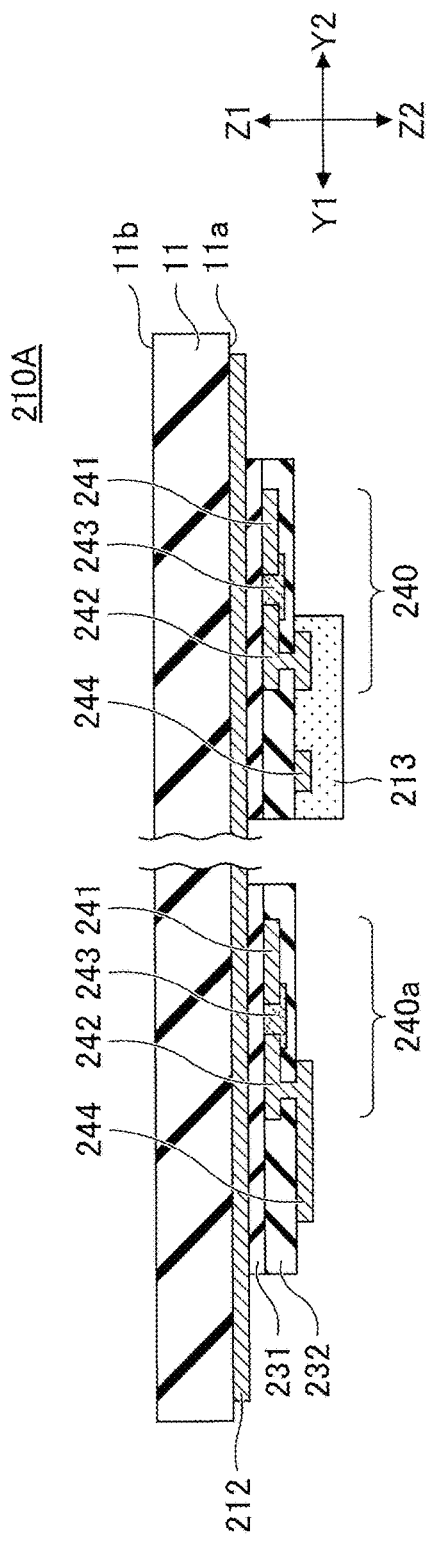
FIG. 22 is a cross-sectional view of a modified example of the unit sensor sheet according to the fourth embodiment of the present invention.

The unit sensor sheet 210A will be described with reference to FIGS. 21 and 22. FIG. 21 is a top view of the unit sensor sheet 210A, which is a transparent view through the substrate 11, and FIG. 22 is an enlarged view of a cross-section of the unit sensor sheet 210A. Although descriptions are omitted because the basic structure and the forming method are the same as those described above, among the 64 thin film transistors 240 illustrated in FIG. 21, to the upper left thin film transistor (denoted as 240a as a matter of convenience), the sensor layer 213 is not coupled. FIG. 22 illustrates a cross-section of one row at the left end of FIG. 21. The sensor layer 213 is coupled to the thin film transistor 240, but is not coupled to the thin film transistor 240a.

Figure 23:
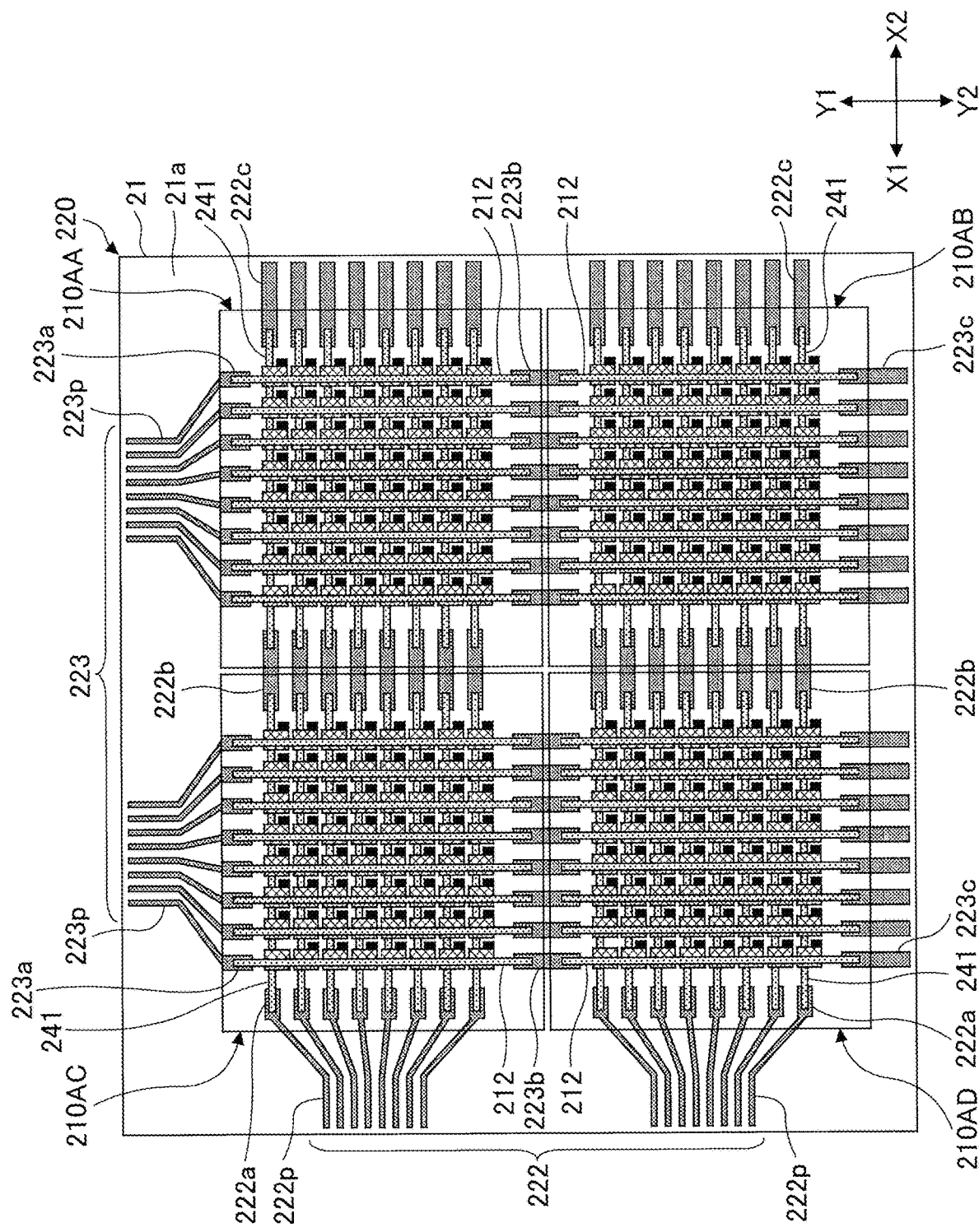
FIG. 23 is an explanatory diagram of a modified example of the sensor sheet according to the fourth embodiment of the present invention.

FIG. 23 illustrates a sensor sheet according to the modified example of the present embodiment and illustrates a state in which four unit sensor sheets 210AA, 210AB, 210AC, and 210AD are coupled to the wiring substrate 220 illustrated in FIG. 18. The unit sensor sheets 210AA, 210AB, 210AC, and 210AD have the same structure as the unit sensor sheet 210A illustrated in FIGS. 21 and 22. The basic structure and the forming method are the same as those described above, and, therefore, the descriptions are omitted.

A driving method according to the modified example of the present embodiment will be described. To the gate electrode 212 that is the Y-wiring layer, when the gate electrode 212 is selected, a gate voltage by which the gate electrode 212 is turned on in the thin film transistor is applied, and when the gate electrode 212 is not selected, a gate voltage by which the gate electrode 212 is turned off in the thin film transistor is applied. To the common electrode 244, a predetermined voltage is applied. Accordingly, the change in the electrical characteristics (e.g., the resistance value) due to the external stimulation in the sensor layer 213 is read, as the source-to-drain current of the thin film transistor coupled in series, from the X-wiring layer that is the source electrode 241, and AD conversion is performed to detect the signal value. At this time, the signal value from the thin film transistor 240a to which the sensor layer 213 is not coupled, is obtained by reading the source-to-drain current of the thin film transistor. The semiconductor layer 243 of the thin film transistor has a property that the resistance decreases (the source-to-drain current increases) as the temperature increases, and, therefore, the signal value from the thin film transistor 240a can be used to perform temperature compensation with respect to the sensor signal value. When an organic semiconductor is used as the semiconductor layer 243, the resistance temperature coefficient is relatively high, so that an organic semiconductor is particularly effective. Organic semiconductors can be formed by printing, and are thus suitably used in view of the low manufacturing cost.

The temperature compensation according to the modified example of the present embodiment will be described. It is assumed that the source-to-drain resistance (the resistance between the source and the drain) of the thin film transistor 240a at a reference temperature T0 is R0, and the source-to-drain resistance of the thin film transistor 240a at a temperature T1 is R1. The resistance temperature coefficient of the sensor layer 213 is generally smaller than the resistance temperature coefficient of the semiconductor layer 243, and, therefore, assuming that the resistance of the sensor layer (at the time of applying external stimulation such as pressure) at the temperature T0 and the temperature T1 is set to r (the same value), the combined resistance of the sensor layer and the thin film transistor becomes R0+r at the temperature T0 and R1+r at the temperature T1. Assuming that the source-to-common voltage (the voltage between the source and the common electrode) is Vc, the source-to-drain current is It0=Vc/R0 at the thin film transistor 240a at temperature T0 and the source-to-drain current is It1=Vc/R1 at the thin film transistor 240a at temperature T1. Further, the source-to-drain current is Is0=Vc/(R0+r) at the thin film transistor 240 coupled to the sensor layer 213 at temperature T0 and the source-to-drain current is Is1=Vc/(R1+r) at the thin film transistor 240 coupled to the sensor layer 213 at temperature T1. Therefore, 1/It0−1/It1=(R0−R1)/Vc, 1/Is0−1/Is1=(R0−R1)/Vc are established, and the output (bit value) B after AD conversion and the current I are proportional, and, therefore, assuming that the bit value of the thin film transistor 240a at temperature T0 is Bt0, the bit value of the thin film transistor 240a at temperature T1 is Bt1, the bit value of the thin film transistor 240 coupled to the sensor layer 213 at temperature T0 is Bs0, and the bit value of the thin film transistor 240 coupled to the sensor layer 213 at temperature T1 is Bs1, the relationship of 1/Bt0−1/Bt1=1/Bs0−1/Bs1, that is, Bs0=1/(1/Bs1+1/Bt0−1/Bt1) can be established. When Bt0 is known in advance, the value of Bt1 can be used to convert Bs1 to the value of Bs0 at the reference temperature T0. As can be seen from the above, the thin film transistor 240a also functions as a temperature sensor.

Fifth Embodiment

Next, a fifth embodiment will be described with reference to FIGS. 25 and 26. The present embodiment is, for example, a sensor sheet having a structure in which a wiring sheet 310 that serves as a dummy is disposed instead of some of the unit sensor sheets 210, in the wiring substrate 220 according to the fourth embodiment. Specifically, there may be a region on the wiring substrate 220 that does not need to be detected by the unit sensor sheet 210, that is, a region that does not require the unit sensor sheet 210. In this case, if the unit sensor sheet 210 and the like is not disposed, the X-wiring layer 222 and the Y-wiring layer 223 remain separated at that portion, and thus the signal of the unit sensor sheet 210 cannot be read. In the present embodiment, in order to avoid this situation, when there is a region where the unit sensor sheet 210 is unnecessary, the wiring sheet 310 that serves as a dummy is disposed instead of the unit sensor sheet 210.

Figure 27:
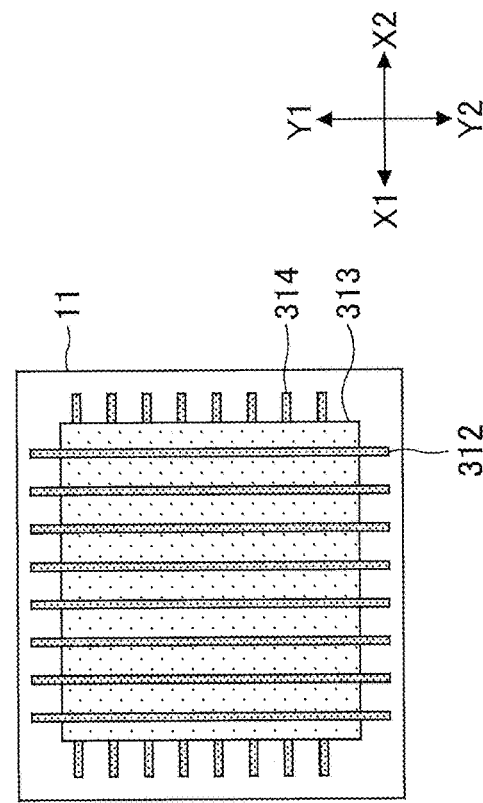
FIG. 27 is an explanatory diagram of the wiring sheet according to the fifth embodiment of the present invention.
Figure 28:
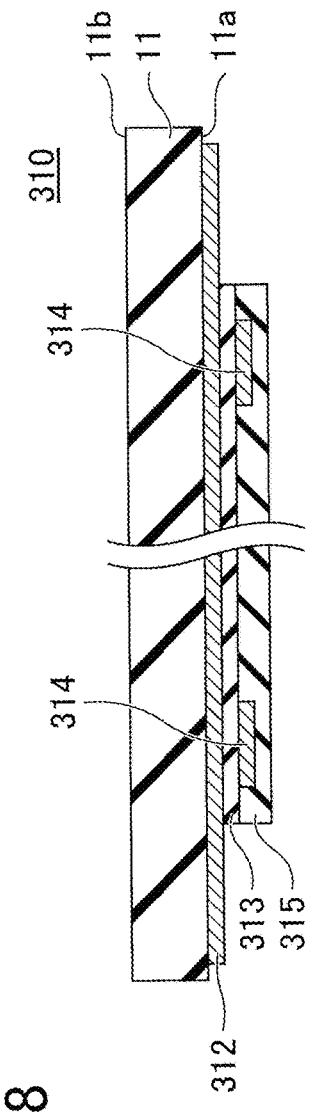
FIG. 28 is a cross-sectional view of a wiring sheet according to the fifth embodiment of the present invention.

As illustrated in FIGS. 27 and 28, the wiring sheet 310 has a plurality of Y-coupling wiring layers 312 formed longitudinally along the Y1-Y2 direction on the one side 11a that is the Z2 side of the square or rectangular substrate 11 having the same size as the unit sensor sheet 210. Further, an insulating film 313 is formed on the Z2 side of the Y-coupling wiring layer 312; a plurality of X-coupling wiring layers 314, which are longitudinally formed along the X1-X2 direction, are formed on the Z2 side of the insulating film 313; and an insulating film 315 is formed on the Z2 side of the X-coupling wiring layer 314. FIG. 27 is a top view of the wiring sheet 310, which is a transparent view through the substrate 11, and FIG. 28 is an enlarged view of a cross-section of the wiring sheet 310.

Figure 25:
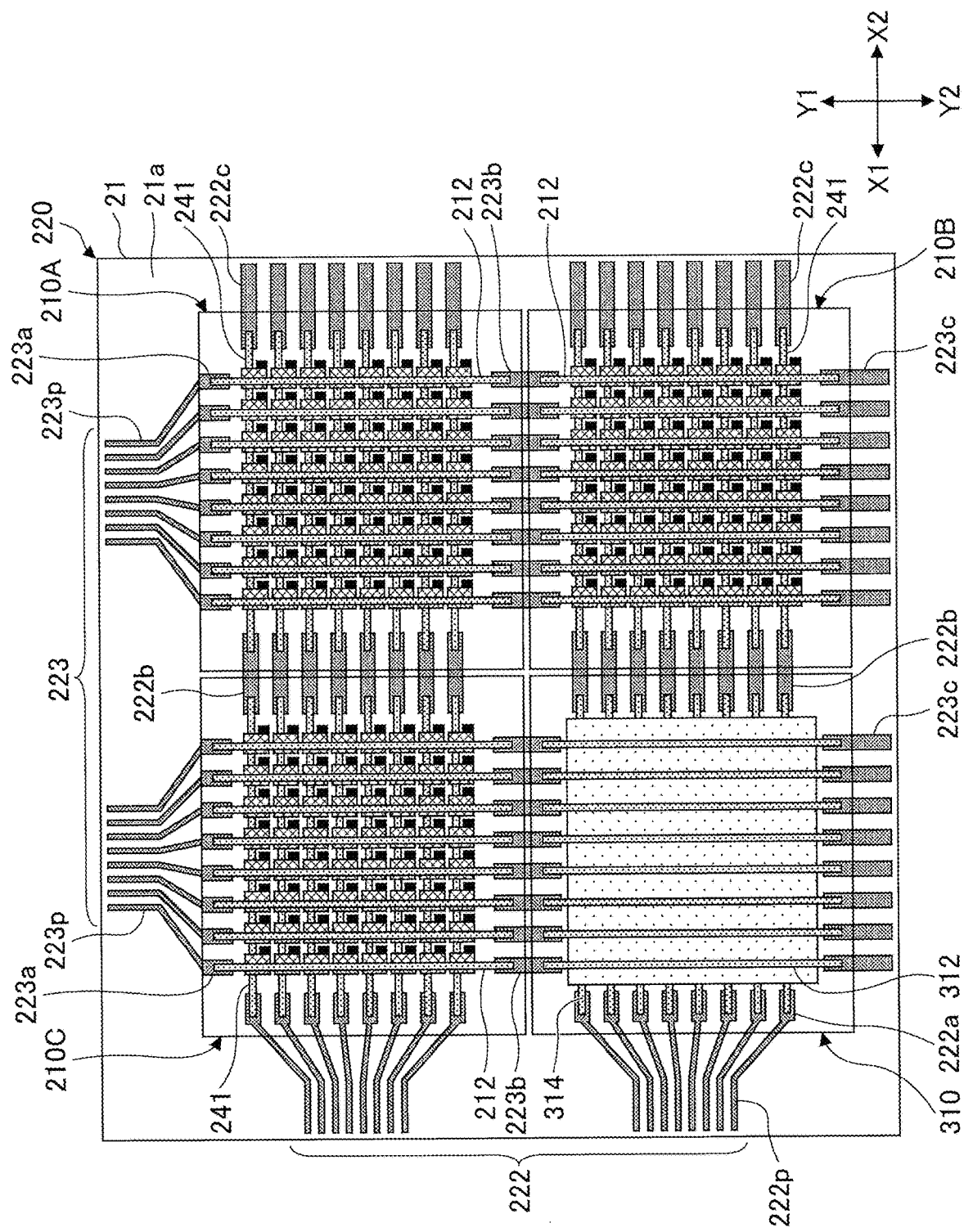
FIG. 25 is an explanatory diagram of a sensor sheet according to a fifth embodiment of the present invention.

As illustrated in FIG. 25, in the sensor sheet according to the present embodiment, three unit sensor sheets 210A, 210B, and 210C and the wiring sheet 310 serving as a dummy are coupled to the wiring substrate 220.

Figure 26:
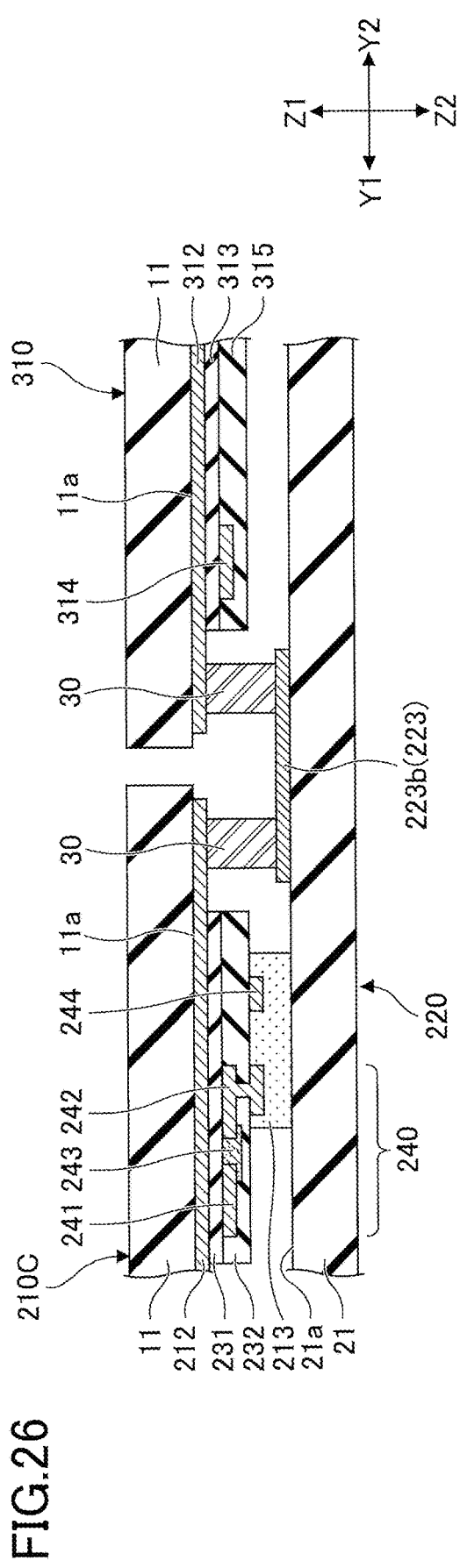
FIG. 26 is a cross-sectional view of the sensor sheet according to the fifth embodiment of the present invention.

FIG. 26 is an enlarged cross-sectional view of the sensor sheet according to the present embodiment. In the sensor sheet according to the present embodiment, the one side 11a of the wiring sheet 310 and the unit sensor sheet 210C and the one side 21a of the wiring substrate 220 on which the Y-wiring layer 223 and the like is disposed are facing each other and are electrically coupled to each other by the conductive bonding member 30.

Specifically, a portion near the end on the Y1 side of the Y-coupling wiring layer 312, disposed on the one side 11a of the wiring sheet 310, and a portion near the end on the Y2 side of the Y-wiring layer 223b, disposed on the one side 21a of the wiring substrate 220, are bonded to each other by the conductive bonding member 30. A portion near the end on the Y2 side of the gate electrode 212, disposed on the one side 11a of the unit sensor sheet 210C, and a portion near the end on the Y1 side of the Y-wiring layer 223b, disposed on the one side 21a of the wiring substrate 220, are bonded to each other by the conductive bonding member 30. Accordingly, the Y-coupling wiring layer 312 of the wiring sheet 310 and the gate electrode 212 of the unit sensor sheet 210C are electrically coupled to each other via the Y-wiring layer 223b bonded by the conductive bonding member 30.

Although not illustrated, a portion near the end on the Y2 side of the Y-coupling wiring layer 312, disposed on the one side 11a of the wiring sheet 310, and the Y-wiring layer 223c, disposed on the one side 21a of the wiring substrate 220, are bonded to each other by the conductive bonding member 30. Further, a portion near the end on the Y1 side of the gate electrode 212, disposed on the one side 11a of the unit sensor sheet 210C, and the Y-wiring layer 223a, disposed on the one side 21a of the wiring substrate 220, are bonded to each other by the conductive bonding member 30. Accordingly, the Y-coupling wiring layer 312 of the wiring sheet 310, the gate electrode 212 of the unit sensor sheet 210C, and the Y-wiring layers 223a, 223b, and 223c of the wiring substrate 220 are electrically coupled to form a Y-wiring layer along the Y1-Y2 direction.

Further, a portion near the end on the X2 side of the X-coupling wiring layer 314, disposed on the one side 11a of the wiring sheet 310, and a portion near the end on the X1 side of the X-wiring layer 222b, disposed on the one side 21a of the wiring substrate 220, are bonded to each other by the conductive bonding member 30. A portion near the end on the X1 side of the source electrode 241, disposed on the one side 11a of the unit sensor sheet 210B, and a portion near the end on the X2 side of the X-wiring layer 222b, disposed on the one side 21a of the wiring substrate 220, are bonded to each other by the conductive bonding member 30. Accordingly, the X-coupling wiring layer 314 of the wiring sheet 310 and the source electrode 241 of the unit sensor sheet 210B are electrically coupled to each other via the X-wiring layer 222b bonded by the conductive bonding member 30.

Similarly, a portion near the end on the X1 side of the X-coupling wiring layer 314, disposed on the one side 11a of the wiring sheet 310, and an X-wiring layer 222a, disposed on the one side 21a of the wiring substrate 220, are bonded to each other by the conductive bonding member 30. A portion near the end on the X2 side of the source electrode 241, disposed on the one side 11a of the unit sensor sheet 210B, and the X-wiring layer 222c, disposed on the one side 21a of the wiring substrate 220, are bonded to each other by the conductive bonding member 30. Accordingly, the X-coupling wiring layer 314 of the wiring sheet 310, the source electrode 241 of the unit sensor sheet 210B, and the X-wiring layers 222a, 222b, and 222c of the wiring substrate 220 are electrically coupled to form a X-wiring layer along the X1-X2 direction.

Modified Example (Fifth Embodiment)

Figure 29:
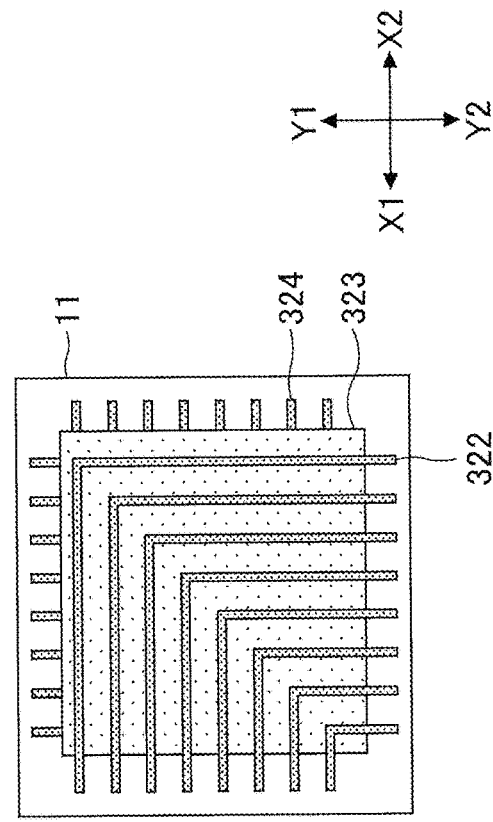
FIG. 29 is an explanatory diagram (1) of a modified example of the wiring sheet according to the fifth embodiment of the present invention.
Figure 30:
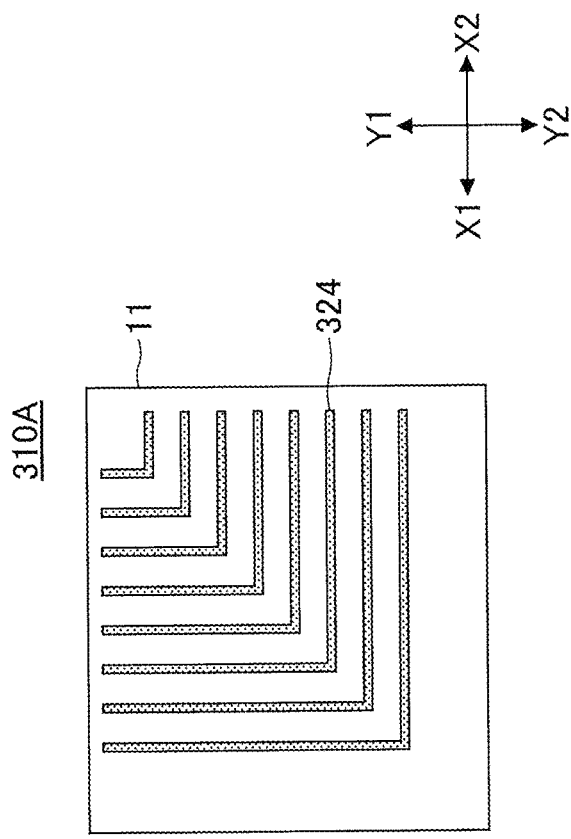
FIG. 30 is an explanatory diagram (2) of a modified example of the wiring sheet according to the fifth embodiment of the present invention.

In the present embodiment, as illustrated in FIGS. 29 and 30, the orientation of a first wiring layer 322 and a second wiring layer 324 provided on a wiring sheet 310A may be changed from the X1-X2 direction to the Y1-Y2 direction. FIG. 29 is a top view of the wiring sheet 310A, which is a transparent view through the substrate 11, and FIG. 30 is a top view of the wiring sheet 310A, which is a further transparent view through the first wiring layer 322 and an insulating film 323. In this modified example, the first wiring layer 322, the insulating film 323, and the second wiring layer 324 are stacked on one side of the substrate 11. The first wiring layer 322 is bent at right angles in the middle and extends in the X1 direction and the Y2 direction. The second wiring layer 324 is bent at right angles in the middle and extends in the X2 direction and the Y1 direction.

In the present modified example, for example, when creating the sensor sheet illustrated in FIG. 8, the direction of the wiring can be changed by disposing the wiring sheet 310A, without providing a portion, in which the wiring layer is bent, on the wiring substrate.

Sixth Embodiment

Figure 31:
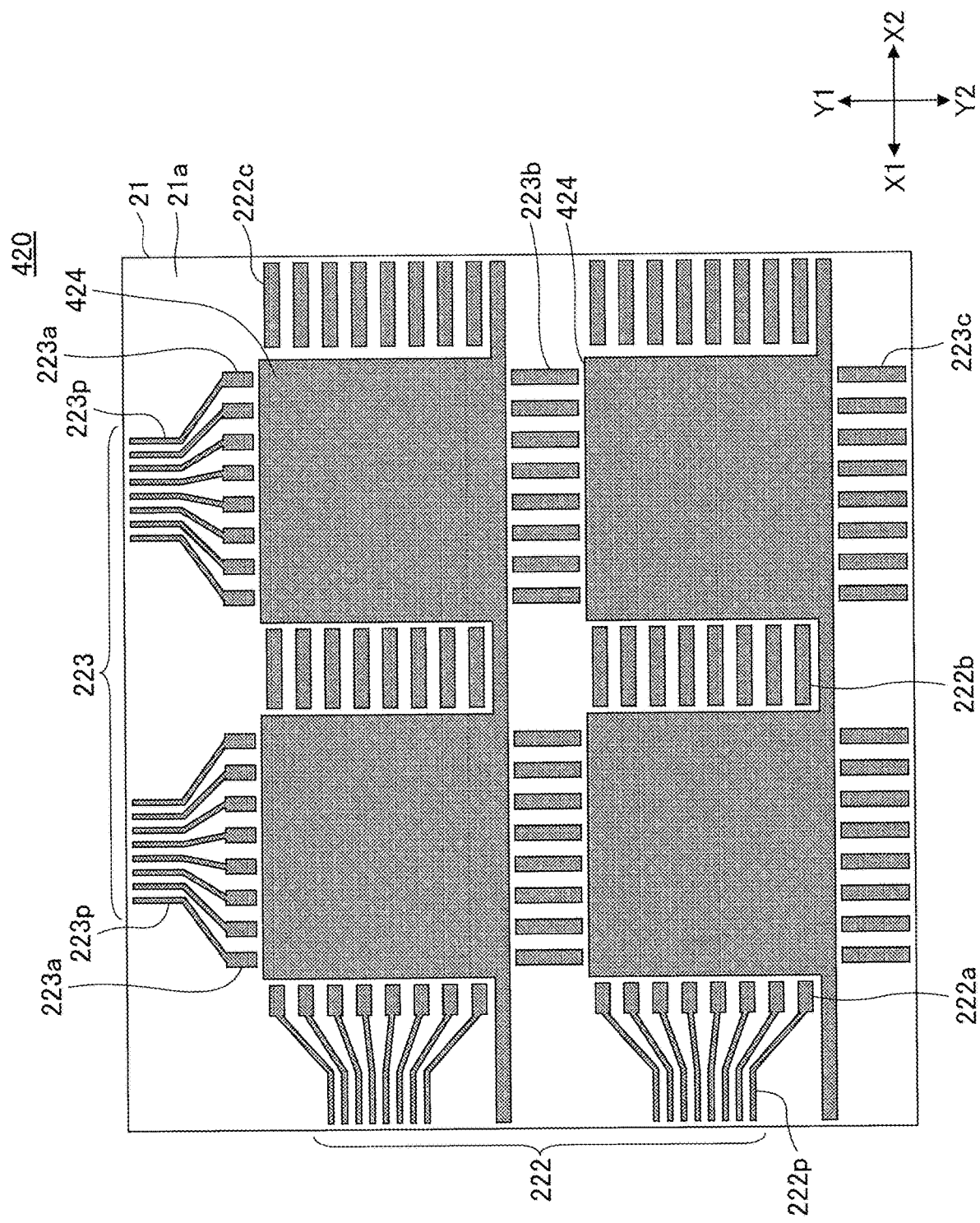
FIG. 31 is a top view of the wiring substrate according to a sixth embodiment of the present invention.

Next, the sixth embodiment will be described. In a sensor sheet according to the present embodiment, as illustrated in FIG. 31, on a wiring substrate 420, a common electrode layer 424 is provided at a central portion where a unit sensor sheet 410 is disposed. FIG. 31 is a top view of the wiring substrate 420. Four of the unit sensor sheets 410 may be coupled to wiring substrate 420.

Figure 32:
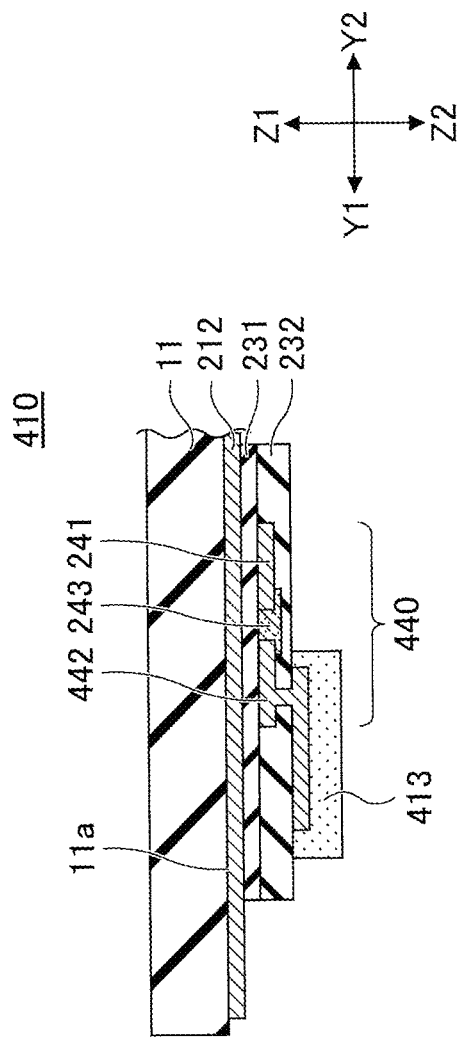
FIG. 32 is a cross-sectional view of a unit sensor sheet according to the sixth embodiment of the present invention.

The unit sensor sheet 410 according to the present embodiment will be described with reference to FIG. 32. The unit sensor sheet 410 is provided with a thin film transistor at each detection point on the one side 11a on the Z2 side of the square or rectangular substrate 11. Specifically, on the one side 11a of the unit sensor sheet 410, a plurality of the gate electrodes 212 are formed longitudinally along the Y1-Y2 direction, and the plurality of gate electrodes 212 are arranged in the X1-X2 direction. The gate insulating film 231 is formed on the Z2 side of the gate electrode 212. The source electrode 241 and a drain electrode 442 are formed on the Z2 side of the gate insulation film 231, and the semiconductor layer 243 is formed between the source electrode 241 and the drain electrode 442 at each detection point. Further, the insulating film 232 is formed on the Z2 side of the source electrode 241 and the semiconductor layer 243, the drain electrode 442 penetrates the insulating film 232 and is also provided on the Z2 side of the insulating film 232, and a sensor layer 413 is provided to cover the drain electrode 442. In the present embodiment, a thin film transistor 440 is formed by the gate electrode 212, the gate insulating film 231, the source electrode 241, the drain electrode 442, the semiconductor layer 243, and the like.

Figure 33:
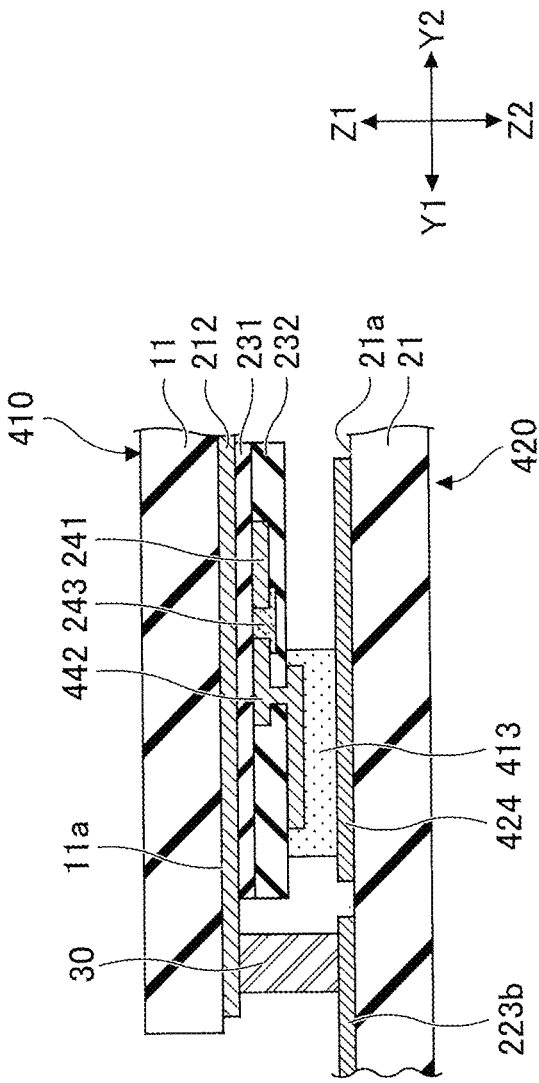
FIG. 33 is a cross-sectional view of the sensor sheet according to the sixth embodiment of the present invention.

FIG. 33 is an enlarged view of a relevant portion of a cross-section of a sensor sheet according to the present embodiment. In the sensor sheet according to the present embodiment, the one side 11a of the unit sensor sheet 410 and the like on which the gate electrode 212 is provided, and the one side 21a of the wiring substrate 420 on which the Y-wiring layer 223 is provided, are facing each other and are electrically coupled to each other by the conductive bonding member 30.

Specifically, a portion near the end on the Y1 side of the gate electrode 212, disposed on the one side 11a of the unit sensor sheet 410, and a portion near the end on the Y2 side of the Y-wiring layer 223b, disposed on the one side 21a of the wiring substrate 420, are bonded to each other by the conductive bonding member 30. The sensor layer 413 of the unit sensor sheet 410 is in contact with the common electrode layer 424 provided on the one side 21a of the wiring substrate 420 on the Z2 side.

The contents other than those described above are the same as those of the fourth embodiment.

Seventh Embodiment

Figure 34:
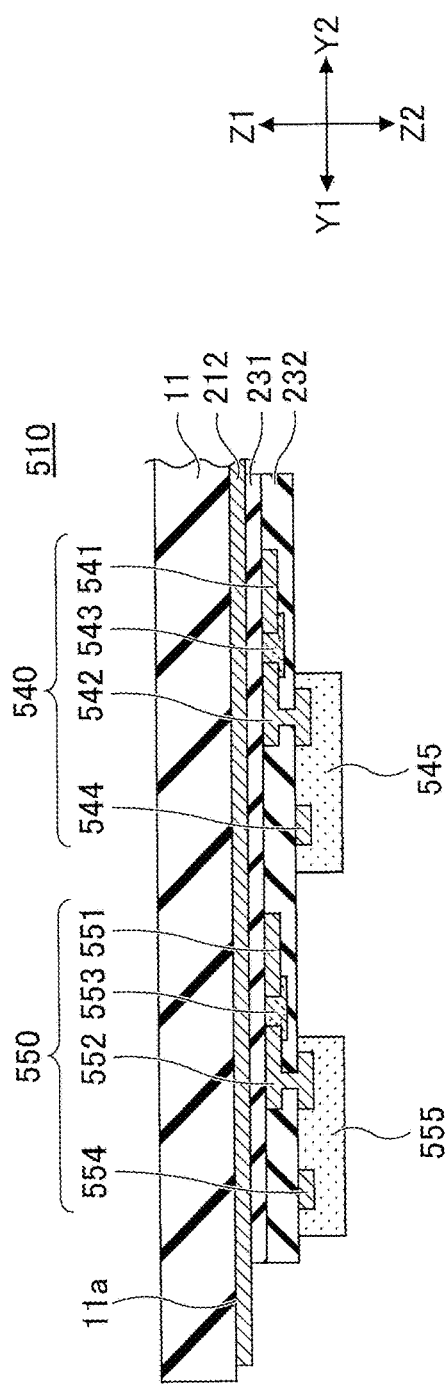
FIG. 34 is a cross-sectional view of a unit sensor sheet according to a seventh embodiment of the present invention.

Next, a sensor sheet according to the seventh embodiment will be described with reference to FIGS. 34 and 35. The sensor sheet according to the present embodiment has a structure in which the unit sensor sheet is provided with sensor layers capable of measuring two different types of physical property values (magnitudes of different physical properties), for example, a sensor layer for detecting pressure and a sensor layer for detecting the temperature. In the sensor sheet according to the present embodiment, for example, the wiring substrate 220 illustrated in FIG. 19 is used.

Based on FIG. 34, a unit sensor sheet 510 according to the present embodiment will be described. The unit sensor sheet 510 is formed of, for example, a first sensor portion 540 for detecting pressure and a second sensor portion 550 for detecting the temperature. Specifically, a plurality of the gate electrodes 212 are formed longitudinally along the Y1-Y2 direction on the one side 11a of the unit sensor sheet 510, and the plurality of the gate electrodes 212 are arranged in an X1-X2 direction. The gate insulating film 231 is formed on the Z2 side of the gate electrode 212. At each detection point on the Z2 side of the gate insulation film 231, a source electrode 541 and a drain electrode 542 are formed in the region where the first sensor portion 540 is formed, and a semiconductor layer 543 is formed between the source electrode 541 and the drain electrode 542. At each detection point, a source electrode 551 and a drain electrode 552 are formed in the region in which the second sensor portion 550 is formed, and a semiconductor layer 553 is formed between the source electrode 551 and the drain electrode 552. Further, the insulating film 232 is formed on the Z2 side of the source electrode 541, the semiconductor layer 543, the source electrode 551 and the semiconductor layer 553.

The drain electrode 542 penetrates the insulating film 232, and on the Z2 side of the insulating film 232, the drain electrode 542 and a common electrode 544 are provided, and further, a first sensor layer 545 covering the drain electrode 542 and the common electrode 544 is provided. The common electrode 544 is coupled to a common wiring (not illustrated) provided on the wiring substrate 220 using a coupling member.

The drain electrode 552 penetrates the insulating film 232, and on the Z2 side of the insulating film 232, the drain electrode 552 and a common electrode 554 are provided, and further, a second sensor layer 555 covering the drain electrode 552 and the common electrode 554 is provided. The common electrode 554 is coupled to a common wiring (not illustrated) provided on the wiring substrate 220 by a coupling member.

Figure 35:
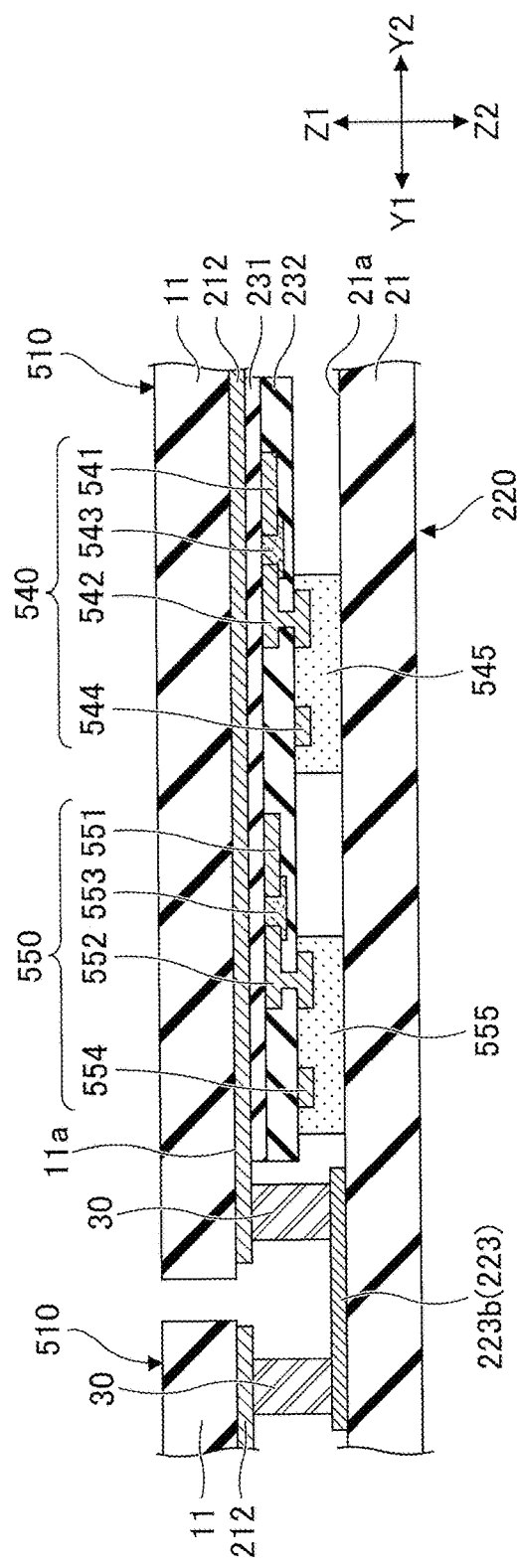
FIG. 35 is a cross-sectional view of a sensor sheet according to the seventh embodiment of the present invention.

In the sheet sensor according to the present embodiment, as illustrated in FIG. 35, the Y-wiring layer 223b of the wiring substrate 220, and the gate electrode 212 of the unit sensor sheet 510, are bonded to each other by the conductive bonding member 30.

Modified Example (Seventh Embodiment)

Figure 36:
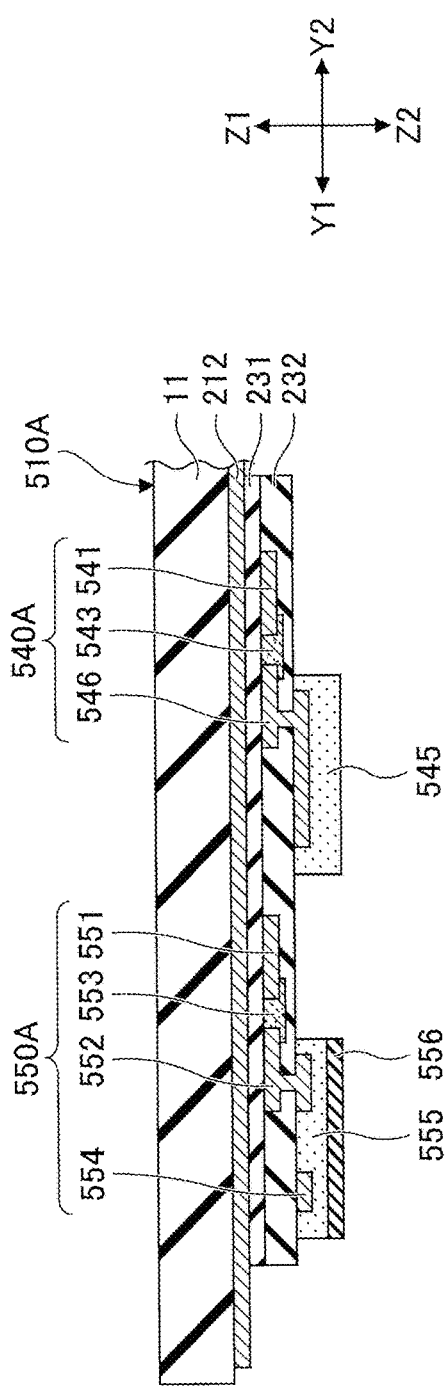
FIG. 36 is a cross-sectional view of a modified example of the unit sensor sheet according to the seventh embodiment of the present invention.

A unit sensor sheet 510A according to the present embodiment may have the structure as illustrated in FIG. 36.

Specifically, the source electrode 541 and a drain electrode 546 are formed at each detection point in the region where a first sensor portion 540A is formed at each detection point, and the semiconductor layer 543 is formed between the source electrode 541 and the drain electrode 546. Further, the insulating film 232 is formed on the Z2 side of the source electrode 541 and the semiconductor layer 543.

The drain electrode 546 penetrates the insulating film 232, and on the Z2 side of the insulating film 232, the first sensor layer 545 covering the drain electrode 546 is provided.

The source electrode 551 and the drain electrode 552 are formed at each detection point at each detection point at each detection point in the region in which a second sensor portion 550A is formed, and the semiconductor layer 553 is formed between the source electrode 551 and the drain electrode 552 at each detection point. Further, the insulating film 232 is formed on the Z2 side of the source electrode 551 and the semiconductor layer 553.

The drain electrode 552 penetrates the insulating film 232, and on the Z2 side of the insulating film 232, the drain electrode 552 and the common electrode 554 are provided, and further, the second sensor layer 555 covering the drain electrode 552 and the common electrode 554 is provided. Further, an insulating film 556 is formed on the Z2 side of the second sensor layer 555.

Figure 37:
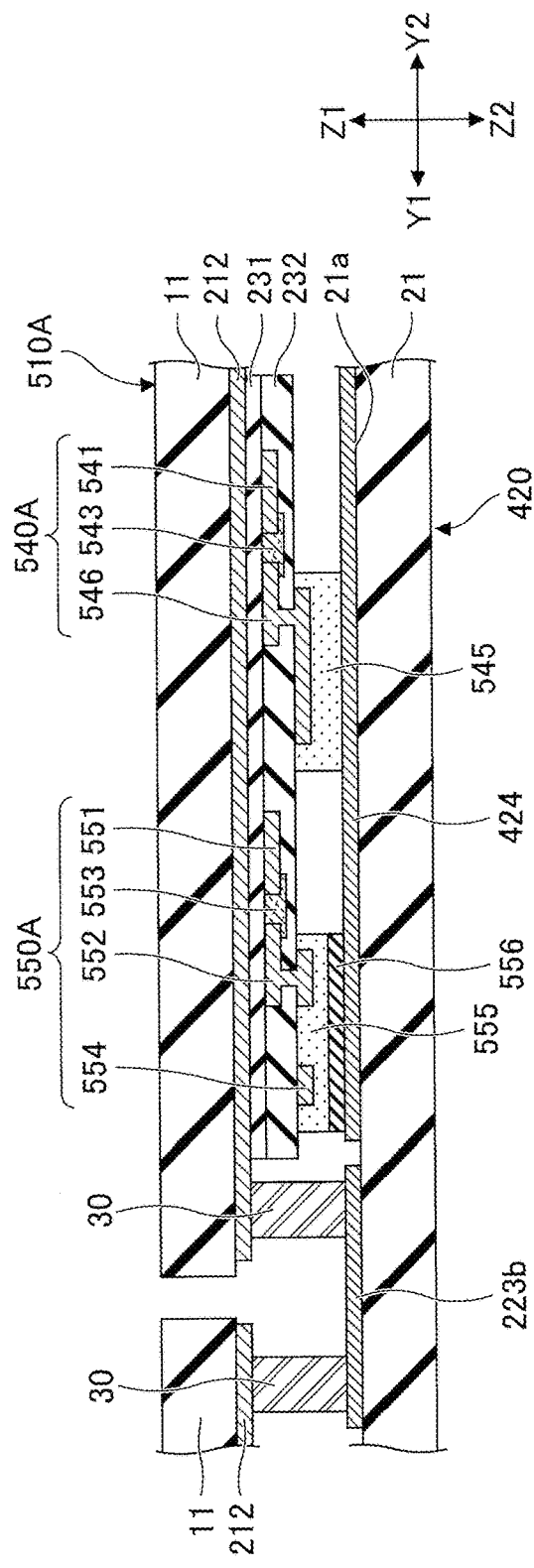
FIG. 37 is a cross-sectional view of a modified example of the sensor sheet according to the seventh embodiment of the present invention.

In the sheet sensor according to the present embodiment, as illustrated in FIG. 37, the Y-wiring layer 223b of the wiring substrate 420, and the gate electrode 212 of the unit sensor sheet 510, are bonded to each other by the conductive bonding member 30. The common electrode layer 424 of the wiring substrate 420 is in contact with the first sensor layer 545, but the insulating film 556 is formed on the Z2 side of the second sensor layer 555, so that the second sensor layer 555 and the common electrode layer 424 do not come in contact with each other.

According to the sensor sheet according to the present embodiment, a single sensor sheet can detect a plurality of physical property values, for example, pressure and the temperature.

Eighth Embodiment

Figure 38:
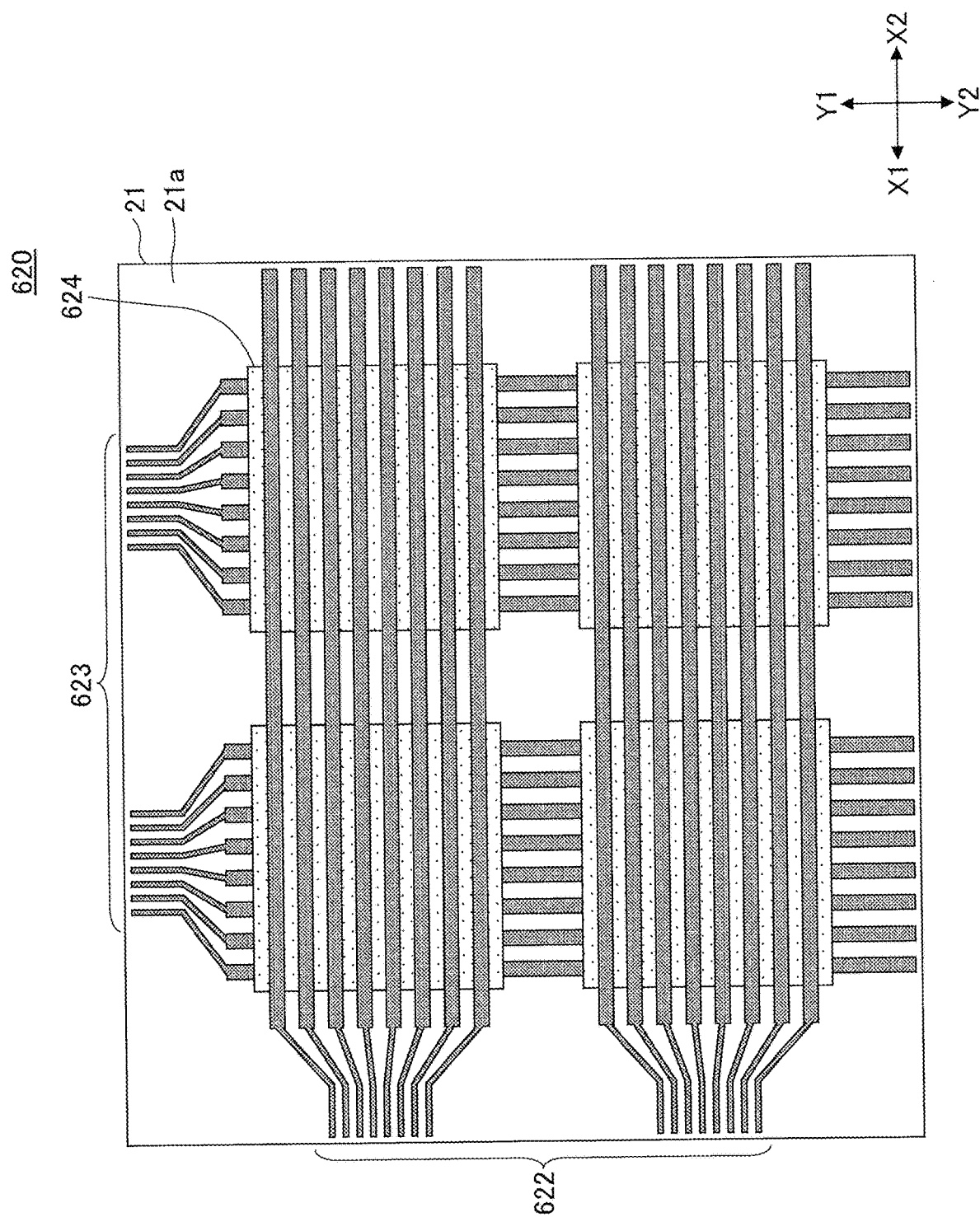
FIG. 38 is a top view of a wiring substrate according to an eighth embodiment of the present invention.
Figure 39:
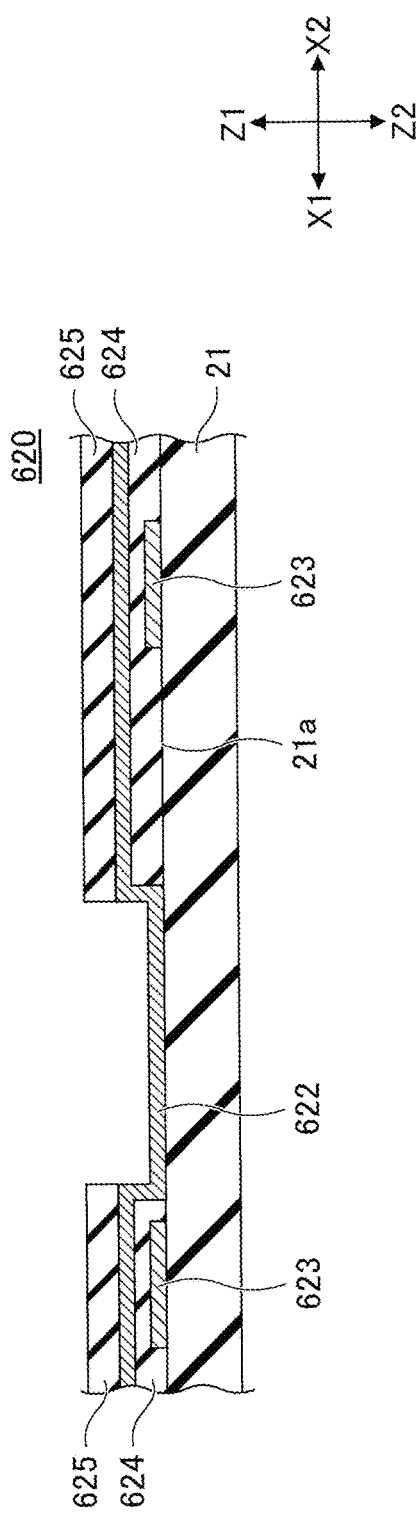
FIG. 39 is a cross-sectional view of the wiring substrate according to the eighth embodiment of the present invention.

Next, the sensor sheet according to the eighth embodiment will be described. FIG. 38 is a top view and FIG. 39 is an enlarged view of the cross-section of a wiring substrate 620 of the sensor sheet according to the present embodiment. In the present embodiment, the wiring substrate 620 is provided with a plurality of Y-wiring layers 623 that are formed longitudinally along the Y1-Y2 direction, and a plurality of X-wiring layers 622 that are formed longitudinally along the X1-X2 direction, on the one side 21a of the substrate 21. Specifically, as illustrated in FIG. 39, the Y-wiring layer 623, an insulating film 624, the X-wiring layer 622, and an insulating film 625 are stacked in the stated order on the one side 21a of the substrate 21, and the Y-wiring layer 623 is insulated from the X-wiring layer 622 by the insulating film 624.

In the present embodiment, the X-wiring layer 622 is insulated from the Y-wiring layer 623 by the insulating film 624, and, therefore, the X-wiring layer 622 and the Y-wiring layer 623 are formed in a continuous shape without being separated. Therefore, even when a unit sensor sheet is not disposed, it is not necessary to dispose the wiring sheet 110 and the like serving as a dummy.

Figure 40:
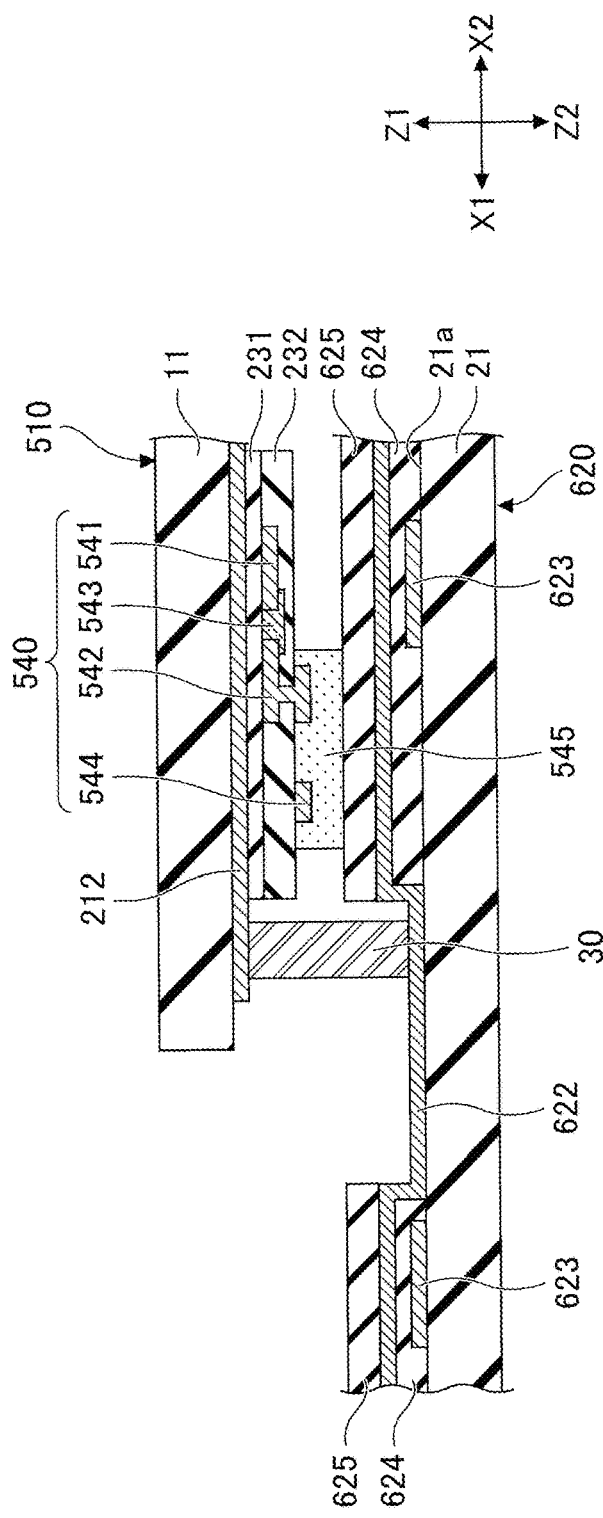
FIG. 40 is a cross-sectional view of a sensor sheet according to the eighth embodiment of the present invention.

FIG. 40 illustrates a state in which the unit sensor sheet 510 is coupled to the wiring substrate 620 according to the present embodiment. In the present embodiment, the X-wiring layer 622 of the wiring substrate 620, and the gate electrode 212 of the unit sensor sheet 510, are bonded to each other by the conductive bonding member 30. Further, although not illustrated, the Y-wiring layer 623 of the wiring substrate 620, and the source electrode 541 of the unit sensor sheet 510, are bonded to each other by the conductive bonding member 30.

In the sensor sheet according to the present embodiment, the wiring substrate 620 and the unit sensor sheet 510 may be coupled at one coupling portion without the need to couple at two end portions in the X1-X2 direction, and may be coupled at one coupling portion without the need to couple at two end portions in the Y1-Y2 direction. This makes it easy to couple the wiring substrate 620 and the unit sensor sheet 510 to each other.

Ninth Embodiment

Figure 41:
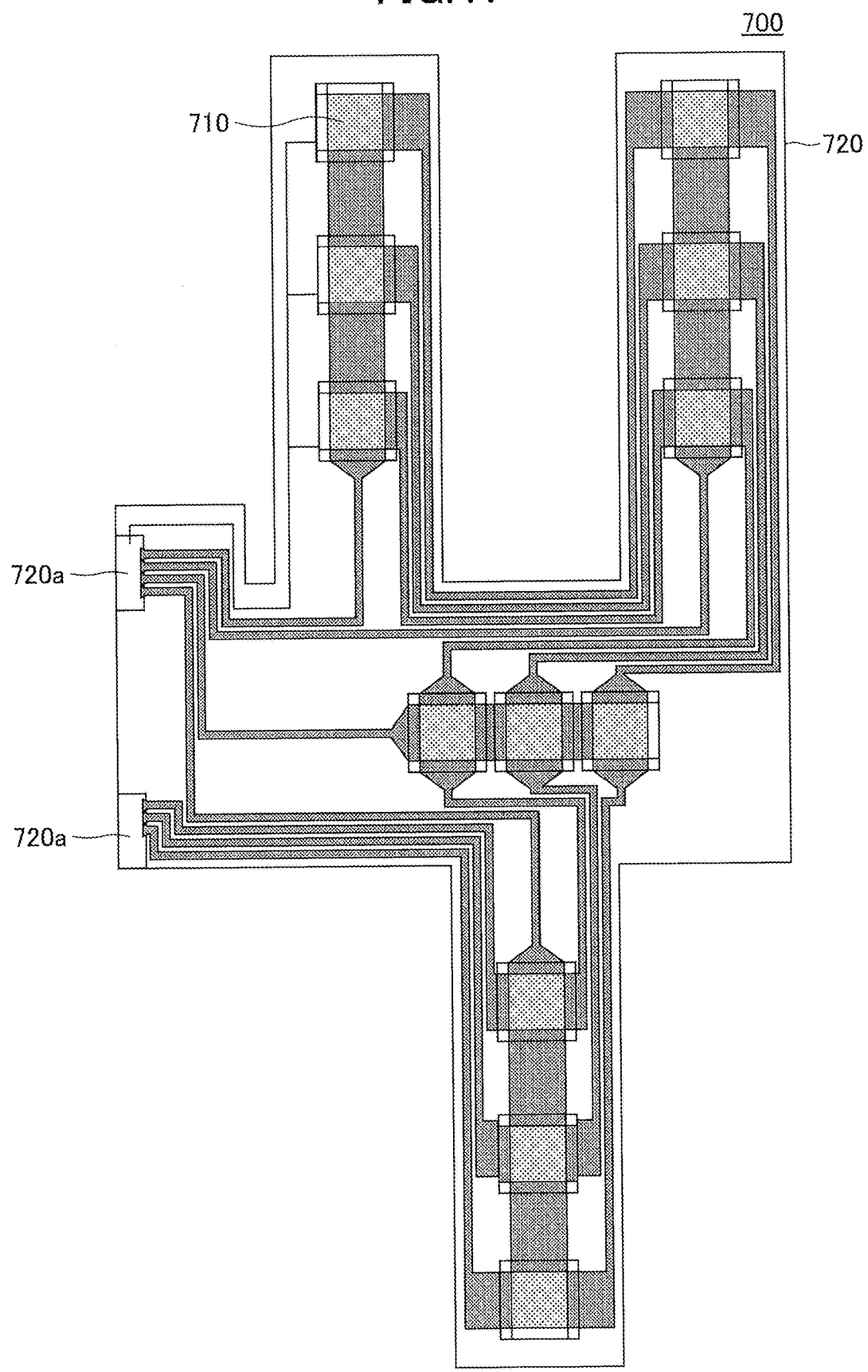
FIG. 41 is an explanatory diagram of a sensor sheet used in a ninth embodiment of the present invention.
Figure 42:
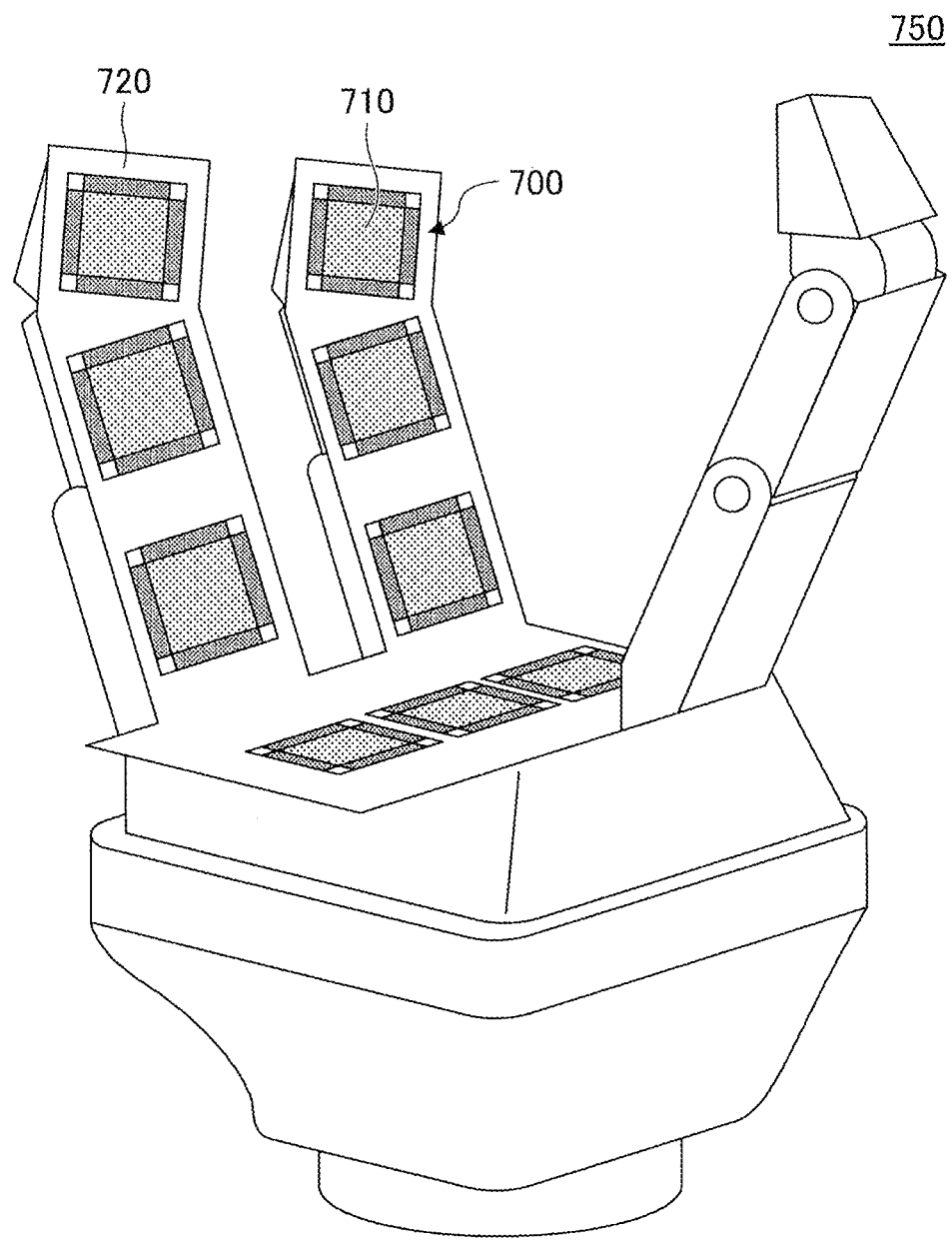
FIG. 42 is an explanatory diagram of the robot hand according to the ninth embodiment of the present invention.

Next, the ninth embodiment will be described. The present embodiment is a robot hand or a glove using the sensor sheet according to the first to eighth embodiments. Specifically, a sensor sheet 700 having a plurality of unit sensor sheets 710 coupled to a wiring substrate 720 as illustrated in FIG. 41, is used. The wiring substrate 720 is formed of a flexible substrate and the like and is easily deformable. The sensor sheet 700 illustrated in FIG. 41 is mounted inside a robot hand 750 illustrated in FIG. 42, so that it is possible to detect the pressure and temperature when the robot hand 750 grasps an object. A terminal 720a of the wiring substrate 720 is coupled to a control board and the like (not illustrated) provided in the robot hand 750 via a flexible printed circuit (FPC).

Figure 43:
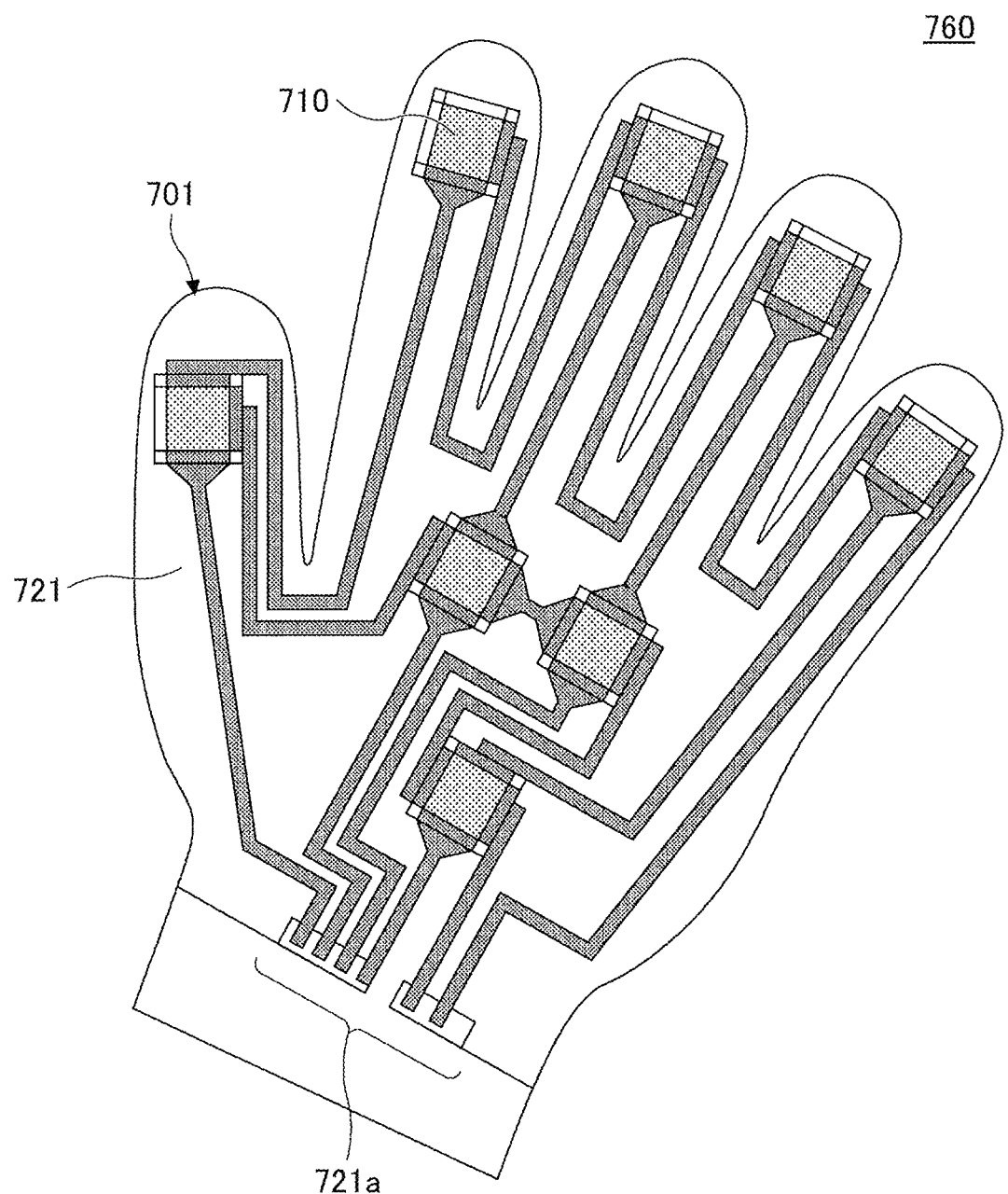
FIG. 43 is an explanatory diagram of a glove according to the ninth embodiment of the present invention.

The present embodiment may also be applied to a glove 760 using a sensor sheet 701 on which a plurality of unit sensor sheets 710 are mounted on a wiring substrate 721, as illustrated in FIG. 43. In this case, the sensor sheet 701 is disposed on the palm side of the glove 760 to detect the pressure and temperature when an object is grasped by the glove 760. A terminal 721a of the wiring substrate 721 is coupled to a control board (not illustrated) and the like via an FPC.

According to one embodiment of the present invention, it is possible to increase the reliability of a sensor sheet that is obtained by electrically coupling a plurality of small-area sensor sheets to each other.

The sensor sheet, the robot hand, and the glove are not limited to the specific embodiments described in the detailed description, and variations and modified examples may be made without departing from the spirit and scope of the present invention.

What is claimed is:

1. A sensor sheet comprising:
   a plurality of unit sensor sheets configured to detect a physical property value at multiple points on a sensor layer, each of the plurality of unit sensor sheets including
      a first substrate, and
      an electrode layer and the sensor layer sequentially formed on one side of the first substrate included in each of the plurality of unit sensor sheets; and
   a wiring substrate to which the plurality of unit sensor sheets are configured to be coupled, the wiring substrate including
      a second substrate, and
      a plurality of wirings provided on one side of the second substrate included in the wiring substrate, wherein
   one side of the wiring substrate and one side of each of the plurality of unit sensor sheets are facing each other, and wherein
   a conductive bonding member configured to electrically couple each of the plurality of unit sensor sheets and the wiring substrate with each other, is included between the electrode layer of each of the plurality of unit sensor sheets and at least one of the plurality of wirings of the wiring substrate.

2. The sensor sheet according to claim 1, wherein the wiring substrate includes:
   a recessed portion provided in a region in which each of the plurality of unit sensor sheets is to be coupled; and
   a protruding portion provided around the recessed portion, and wherein
   another side of each of the plurality of unit sensor sheets and the one side of the wiring substrate are at identical heights in a state where each of the plurality of unit sensor sheets is coupled to the wiring substrate.

3. The sensor sheet according to claim 1, further comprising:
   a wiring sheet including:
      a third substrate having approximately an identical size as each of the plurality of unit sensor sheets; and
      a coupling wiring layer provided on one side of the third substrate included in the wiring sheet, the coupling wiring layer being configured to be coupled to the plurality of wirings, which are separated from each other, of the wiring substrate, wherein
   the coupling wiring layer of the wiring sheet and the plurality of wirings of the wiring substrate are electrically coupled to each other by the conductive bonding member at a portion of the wiring substrate, in a state where the one side of the wiring substrate and the one side of each of the plurality of unit sensor sheets are facing each other.

4. The sensor sheet according to claim 1, wherein each of the plurality of unit sensor sheets is configured to detect the physical property value at multiple two-dimensional points on the sensor layer.

5. The sensor sheet according to claim 4, wherein
each of the plurality of unit sensor sheets includes a thin film transistor provided at each of the multiple two-dimensional points where the physical property value is detected, and
the thin film transistor is coupled to the sensor layer.

6. The sensor sheet according to claim 5, wherein the wiring substrate includes an electrode that contacts one side of the sensor layer of each of the plurality of unit sensor sheets facing the wiring substrate.

7. The sensor sheet according to claim 1, wherein
the sensor layer includes a first sensor layer and a second sensor layer, and
the first sensor layer and the second sensor layer are configured to detect different physical property values.

8. A robot hand comprising the sensor sheet according to claim 1.

9. A glove comprising the sensor sheet according to claim 1.

* * * * *